(12) United States Patent
Taguchi et al.

(10) Patent No.: US 7,287,211 B2
(45) Date of Patent: Oct. 23, 2007

(54) DATA READOUT DEVICE AND DATA READOUT METHOD

(75) Inventors: Masakazu Taguchi, Kawasaki (JP); Akihiro Itakura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 477 days.

(21) Appl. No.: 10/339,548

(22) Filed: Jan. 9, 2003

(65) Prior Publication Data
US 2003/0131305 A1 Jul. 10, 2003

(30) Foreign Application Priority Data
Jan. 9, 2002 (JP) .............................. 2002-002264

(51) Int. Cl.
*H03M 13/03* (2006.01)
*H03M 13/00* (2006.01)
(52) U.S. Cl. ...................... 714/794; 714/795; 714/780
(58) Field of Classification Search ................ 714/794, 714/795, 780
See application file for complete search history.

(56) References Cited

U.S. PATENT DOCUMENTS

| | | | |
|---|---|---|---|
| 5,734,962 A * | 3/1998 | Hladik et al. ............... | 455/12.1 |
| 5,933,462 A * | 8/1999 | Viterbi et al. ................ | 375/341 |
| 5,938,791 A | 8/1999 | Narahara .................... | 714/795 |
| 5,949,796 A * | 9/1999 | Kumar ........................ | 370/529 |
| 5,970,445 A * | 10/1999 | Yamamoto et al. .......... | 704/230 |
| 6,029,264 A * | 2/2000 | Kobayashi et al. .......... | 714/755 |
| 6,069,856 A | 5/2000 | Mita et al. .................... | 369/48 |
| 6,108,811 A * | 8/2000 | Nakamura et al. ........... | 714/795 |
| 6,215,744 B1 | 4/2001 | Mita et al. .................. | 369/47.24 |
| 6,233,709 B1 * | 5/2001 | Zhang et al. ................ | 714/774 |
| 6,298,461 B1 * | 10/2001 | Tong et al. .................. | 714/755 |
| 6,347,124 B1 * | 2/2002 | Antia et al. .................. | 375/341 |
| 6,507,621 B2 * | 1/2003 | Matsumoto et al. ........ | 375/262 |
| 6,526,539 B1 | 2/2003 | Yano et al. .................. | 714/794 |

(Continued)

FOREIGN PATENT DOCUMENTS

JP 2001-285080 10/2001

OTHER PUBLICATIONS

Performance of High Rate Turbo Codes on a PR4-Equalized Magnetic Recording Channel; William E. Ryan; *IEEE*; Jun. 1998; pp. 947-951.

*Primary Examiner*—Joseph D. Torres
(74) *Attorney, Agent, or Firm*—Greer, Burns & Crain, Ltd.

(57) ABSTRACT

A data readout device generates decoded data based on a data bit determined by performing a hard-decision on likelihood data. The likelihood data is generated using an iterative decoding method corresponding to a turbo-coding process. The decoding process is performed on a sampled value obtained by sampling a signal read out from a magneto-optical disk at a predetermined sampling period. A reliability determination part detects whether each obtained data bit was obtained from likelihood data within a predetermined range defined with respect to a histogram of log likelihood ratios. When it is detected that a data bit was obtained by a hard-decision on likelihood data within the predetermined range, the data bit is regarded as being obtained by a hard-decision whose reliability is not sufficient. In this way, the error correcting decoder can perform ECC-based decoding operations including loss-correction processes depending on respective reliability-determination results that distinguish reliabilities among respective data bits.

18 Claims, 16 Drawing Sheets

U.S. PATENT DOCUMENTS 6,606,724 B1 *  8/2003  Krieger et al. .............. 714/755
6,687,205 B1 *  2/2004  Huber ..................... 369/47.19
2001/0019522 A1    9/2001  Mita et al. ............... 369/47.19
2002/0172303 A1 * 11/2002  Matsumoto et al. ........ 375/340

* cited by examiner

FIG.11

| a>b | c>d | e>f | data UK | flag bit | note |
|---|---|---|---|---|---|
| true | true | true | 1 | 0 | $Lp<L(u*)$ |
| | | fail | – | – | since $Lm<Lp$, $L(u*)>Lp$ and $L(u*)\leq Lm$ never occur |
| | fail | true | 1 | 1 | $Lm<L(u*)\leq Lp$ |
| | | fail | – | – | since $Lo>Lm$, $L(u*)>Lo$ and $L(u*)\leq Lm$ never occur |
| fail | true | true | – | – | since $Lo<Lp$, $L(u*)>Lo$ and $L(u*)<L(u*)$ never occur |
| | | fail | – | – | since $Lm<Lp$, $L(u*)>Lp$ and $L(u*)\leq Lm$ never occur |
| | fail | true | 0 | 1 | $Lm<L(u*)\leq Lp$ |
| | | fail | 0 | 0 | $L(u*)\leq Lm$ |

| c>d | e>f | data $U_K$ | flag bit | note |
|---|---|---|---|---|
| true | true | 1 | 0 | $L_p < L(u*)$ |
| | fail | – | – | since $L_m < L_p$, $L(u*) > L_p$ and $L(u*) \leq L_m$ never occur |
| fail | true | 1/0 | 1 | $L_m < L(u*) \leq L_p$ |
| | fail | 0 | 0 | $L(u*) \leq L_m$ |

×:ERROR DATA
△:LOST DATA

LOG LIKELIHOOD RATIO

ABSOLUTE VALUE OF PEAK

LOG LIKELIHOOD RATIO

DATA READOUT DEVICE AND DATA READOUT METHOD

BACKGROUND OF THE INVENTION

1. Field of the Invention

The present invention generally relates to data readout methods and devices, for example, magnetic disk drives, magneto-optical disk drives or other optical disk drives, and magnetic tape drives. More specifically, the present invention relates to a data readout scheme for reading out data from a data-recording medium by using an iterative decoding method, wherein the data-recording medium contains data recorded by a turbo-coding method.

2. Description of the Related Art

Turbo-coding methods have large encoding gains and are known in the telecommunication field. A typical turbo coding system can encode a data bit string "u" by using two encoders that perform recursive systematic convolutional coding. Such a turbo coding system is shown in FIG. 1. Another but still typical turbo coding system is shown in FIG. 2.

The turbo coding system shown in FIG. 1 is made up of a first encoder 11, an interleaver "π1" 12, a second encoder 13 and a multiplexer 14. The data bit string "u" is supplied to the first encoder 11. The data bit string "u" is also supplied to the second encoder 13 via the interleaver "π1" 12.

The first encoder 11 and the second encoder 13 are the aforementioned two encoders that perform recursive systematic convolutional coding. The first encoder 11 generates a parity bit string "p1" based on the data bit string "u" input into the first encoder 11. The data bit string "u" is also input into the interleaver "π1" 12, which outputs a series of signals that is obtained by transforming the bit sequence of the data bit string "u". The second encoder 13 generates a parity bit string "p2" based on the series of signals from the interleaver "π1" 12.

The multiplexer (MUX/puncture) 14 generates a coded data bit string "yk" by combining the data bit string "u", the parity bit string "p1" output from the first encoder 11 and the parity bit string "p2" output from the second encoder 13, in accordance with a predetermined rule. When combining the data bit string "u", the parity bit string "p1" and the parity bit string "p2", the multiplexer 14 performs a puncturing function wherein the bits are thinned out (by omitting some of the bits) in accordance with a predetermined rule to increase the coding ratio. The coded data bit string "yk" generated in the above-mentioned manner is output from the aforementioned turbo coding system. In telecommunication systems, such coded data bit strings ("yk") are modulated in accordance with predetermined rules and are sent out from transmitters.

On the other hand, the turbo coding system shown in FIG. 2 is made up of two recursive systematic convolutional encoders (i.e., a first encoder 11 and a second encoder 13) connected in series. In this conventional example, a data bit string "u" is subjected to an encoding process at the first encoder 11 and a series of signals obtained by the encoding process is output to an interleaver "π1" 12. The interleaver "π1" 12 transforms the bit sequence of this series of signals and outputs a series of signals to the second encoder 13. The second encoder 13 performs an encoding process on the series of signals output from the interleaver "π1" 12. A series of signals obtained by this encoding process is output as a coded data bit string "yk".

When a signal sent out from the aforementioned transmitter is received at a receiver, the received signal is demodulated at the receiver so as to obtain series of value-signals "U", "Y1" and "Y2" respectively corresponding to the data bit string "u", the first parity bit string "p1" and the second parity bit string "p2" that are contained in the coded data bit string "yk". These series of value-signalss "U", "Y1" and "Y2" are input into a decoding system that matches the aforementioned turbo coding system.

In this decoding system, soft-output decoding processes are performed at two decoders that correspond to the aforementioned two encoders, wherein soft-out data (more specifically, likelihood data) with respect to each data bit obtained from one decoder are supplied to the other decoder as ex-ante data. This series of operations is performed repeatedly. FIG. 3 illustrates a block diagram of a decoding system for processing the demodulated series of signals "U", series of signals "Y1" and series of signals "Y2" corresponding to the respective bit strings "u", "p1" and "p2" that are contained in the data bit string "yk" output from the turbo coding system shown in FIG. 1.

As shown in FIG. 3, the decoding system is made up of a first SISO (Soft-In Soft-Out) decoder 21, an interleaver "π1" 22, another interleaver "π1" 23, a de-interleaver "$\pi_1^{-1}$" 25, a second SISO decoder 24 and a hard-decision section 26. The first SISO decoder 21 corresponds to the aforementioned first encoder 11. The second SISO decoder 24 corresponds to the aforementioned second encoder 13.

The aforementioned received series of value-signals "U" and "Y1" are input to the first SISO decoder 21. In addition, the ex-ante data "L(u)" from the second SISO decoder 24 are input to the first SISO decoder 21. The first SISO decoder 21 performs a MAP (Maximum A-posteriori Probability) decoding process for estimating a posteriori probabilities on respective bits. The a posteriori probabilities show the probabilities of whether the respective bits "uk" are "0" or "1" under the condition that the series of value-signals "Y" (y0, y1, . . . , yk, . . . , yn) is detected. In the MAP decoding process, a log-likelihood ratio "L(u*)", i.e., the log ratio of the a posteriori probability "P(uk|Y)" is calculated according to the following formula:

$$L(u^*)=L(uk|Y)=ln\{P(uk=1|Y)/P(uk=0|Y)\} \qquad (1)$$

The series of value-signals "Y" stands for the received series of value-signals "U" and "Y1" in the above formula "(1)".

The probability "P(uk=1|Y)" that the aforementioned bit "uk" is equal to "1" and the probability "P(uk=0|Y)" that the aforementioned bit "uk" is equal to "0" are calculated based on a trellis diagram that shows the state transition obtained from the series of value-signals "U" and "Y1".

On the other hand, the aforementioned log-likelihood ratio L(u*) is also expressed in the following formula:

$$L(u^*)=Lc \times yk+L(uk)+Le(uk) \qquad (2);$$

wherein "Lc×yk" indicates a communication channel value (more specifically, "Lc" is a constant that depends on S/N (i.e., communication channel value constant) and "yk" stands for the received series of signals "y0, y1, . . . , yn"); "L(uk)" stands for the ex-ante data which are used as the known occurrence probabilities with respect to "uk=1" and "uk=0"; and "Le(uk)" stands for external likelihood data about the bit "uk" that are obtained from constraints of codes.

The first SISO decoder 21 calculates the external likelihood data "Le(uk)" based on the above formula "(2)", i.e., more specifically, based on the following formula:

$$Le(uk)=L(u^*)-Lc \times yk-L(uk) \qquad (3)$$

The external likelihood data "Le(uk)" are obtained by substituting the aforementioned log likelihood ratio "L(u*)" calculated as stated above (in accordance with formula "(1)") into formula "(3)". A series of the external likelihood data "Le(uk)" thus obtained one after another is rendered to become a series of the ex-ante data "L(uk)" by way of the interleaver "π1" 23, which is then supplied to the second SISO decoder 24. In addition to the series of the ex-ante data "L(uk)", the series of value-signals "U" input into the decoding system is supplied to the second SISO decoder 24 via the interleaver "π1" 22. Further, the series of value-signals "Y2" is supplied to the second SISO decoder 24.

The second SISO decoder 24 calculates a new log-likelihood ratio "L(u*)" by taking the input ex-ante data "L(uk)" into consideration in accordance with the formula "(1)". The second SISO decoder 24 calculates external likelihood data "Le(uk)" in accordance with the formula "(3)" by using the resulting new log-likelihood ratio "L(u*)" and the ex-ante data "L(uk)" supplied from the first SISO decoder 21.

The external likelihood data "Le(uk)" generated at the second SISO decoder 24 are sent into the de-interleaver "$\pi_1^{-1}$" 25 which outputs data as new ex-ante data "L(uk)" to the first SISO decoder 21. Then, the first SISO decoder 21 takes the ex-ante data "L(uk)" into consideration and calculates log likelihood ratios "L(u*)" and external likelihood data "Le(uk)" in accordance with the abovementioned procedure. The external likelihood data "Le(uk)" are used to generate exante data "L(uk)" for the second SISO decoder 24 via the interleaver 23.

As stated above, each one of the first SISO decoder 21 and the second SISO decoder 24 repeats the process of calculating the log likelihood ratios "L(u*)" by using the external likelihood data "Le(uk)" calculated in the other decoder as the ex-ante data "L(uk)". In short, they perform iterative decoding. It should be noted that the initial value of ex-ante data "L(uk)" (i.e., that which is used in the first-time process) of the first SISO decoder 21 is zero ("L(uk)=0").

The hard-decision section 26 performs a hard-decision based on the log likelihood ratio "L(u*)" generated at the second SISO decoder 24 when a predetermined number of repetitions of the abovementioned decoding process is finished. In this hard decision, the hard-decision section 26 decides whether the bit "uk" is "0" or "1". For example, when the log likelihood ratio "L(u*)" is positive (i.e. L(u*) >0), the hard-decision section 26 decides that the bit "uk" is "1" (i.e. uk=1). When the log likelihood ratio "L(u*)" is less than zero (i.e. L(u*)<0), the hard-decision section 26 decides that the bit "uk" is "0" (i.e. uk=0). Thereafter, the decided result is output as a decoded result "Uk".

During the repetition of the above decoding process (i.e., while the iterative decoding is performed), the probability of the bit "uk" taking the correct original value (i.e., one of "1" and "0") increases gradually, and the probability of the bit "uk" taking the other value decreases gradually, thereby increasing the difference between the probability that the bit "uk" is "1" and the probability that the bit "uk" is "0". Thus, the reliability of the decisions of the hard-decision section 26 is increased.

The turbo coding method and the corresponding decoding method applicable for telecommunication systems as stated above have been reviewed with a view of applying them to data writing/reading units such as magnetic disk drives or optical disk drives. For example, a magnetic disk drive employing a turbo coding method and a corresponding decoding method was proposed in "W. E. Ryan, 'Performance of High Rate Turbo Codes on a PR4-Equalized Magnetic Recording Channel', Proc. IEEE Int. Conf. On Communications, pp. 947-951, 1998".

In this type of data writing/reading unit, the above turbo coding method is employed in its recording system (writing system) that writes data into a recording medium, and the above iterative decoding method is employed in its data-readout system (reading system) that reads out data from the recording medium. These methods makes it possible for the data writing/reading unit to reduce errors when the unit reads out data stored at high density in recording media (for example, magnetic disks, optical disks (including magneto-optical disks) and magnetic tapes).

FIG. 4 shows an illustrative frequency distribution curve of log-likelihood ratios "L(u*)" (i.e., a histogram in the form of a diagram indicating the log-likelihood ratio "L(u*)" plotted as the abscissa and the frequency plotted as the ordinate) that are obtained by the decoding processes that decode random data, with a data readout unit that uses an iterative decoding method to decode data like the unit as stated above, when the SNR (Signal to Noise Ratio) is good and/or when the decoding process is repeated a sufficiently large number of times. In this case, the distribution of the log-likelihood ratios "L(u*)" takes the shape having concentrated areas that are generally separated to both sides of the vertical dotted line that intersects the origin 0, wherein falling within the "+" side means that the probability of "uk" being "1" is larger than the probability of "uk" being "0". To be within the "−" side means that the probability of "uk=0" is larger than the probability of "uk=1". Therefore, it is possible to decode data correctly, by applying the aforementioned hard-decision method on the log likelihood ratios "L(u*)", employing the value 0 as the slice level "L0".

On the other hand, in bad conditions, i.e., when the SNR is poor, or when the number of repetitions of the decoding process in the iterative decoding method is not sufficiently large with relatively good SNR, the distribution of the log likelihood ratios "L(u*)" obtained by the decoding processes that decode the above random data is represented by a curve as shown in FIG. 5. This curve shows some frequency for any log likelihood ratio "L(u*)" between the two specific log likelihood ratios "L(u*)" that present the two local-maximum frequencies, therefore, this curve is considered to show no clear separation to the "+" side and the "−" side. When log likelihood ratios "L(u*)" that take place in accordance with this type of distribution curve are subjected to hard-decisions employing the value 0 as the slice level "L0", decisions on log likelihood ratios "L(u*)" whose values are in the neighborhood of 0 are not necessarily correct. Thus, possibly, some data may be incorrectly decoded.

Starting from these conditions, and thereafter increasing the number of repetitions of the decoding process, it is possible to change the distribution curve of the log likelihood ratios "L(u*)" in such a manner as to be separated to the "+" side and the "−" side as shown in FIG. 4.

However, such increase in the number of repetitions of the decoding process brings about an increase of time required for the data decoding processes, and, thus, the data transfer rate is reduced.

SUMMARY OF THE INVENTION

It is therefore an object of the present invention to provide a data readout scheme that is capable of decoding data relatively correctly and of keeping the data transfer rate from being reduced.

The object of the present invention can be achieved based on a data readout scheme that generates decoded data based on a decided data bit decided by performing a hard-decision on likelihood data, wherein said likelihood data are generated in accordance with an iterative decoding method corresponding to a turbo-coding process, wherein the iterative decoding process is performed on a sampled value obtained by sampling a signal read out from a data recording medium at a predetermined sampling period, said data readout scheme comprising:

a reliability determination part that determines whether each data bit is one obtained from likelihood data within a predetermined range where a hard-decision is regarded as lacking sufficient reliability; and an error correcting decoder that performs an error correcting decoding operation using a predetermined rule and using a result of reliability determination determined in said reliability determination part corresponding to said data bit so as to generate said decoded data.

With such a data readout scheme or device, error-correcting decoding processes performed on respective data bits can use those determined results as to whether respective data bits are the ones obtained by hard-decisions on likelihood data within a predetermined range that is determined as being not sufficiently reliable to make such a hard-decision. Therefore, according to the present invention, a greater amount of information can be used when performing error correction on respective data bits obtained by respective hard-decisions, therefore, it becomes possible to correct a greater number of errors in the data bits.

With a view of obtaining more reliable likelihood data to make more reliable hard-decisions, it is necessary to increase the number of times to repeat the decoding cycle in the iterative decoding process. However, the above scheme allows a greater amount of unreliable hard-decision results because of increased capability of correcting a great amount of data bits by using the results of reliability determination effectively (for example, by performing loss-correction or omitting error check on data bits determined as unreliable data bits).

Thus, according to the above scheme of the present invention, even when there is not sufficient reliability in hard-decisions that decide data bits based on the likelihood data, it becomes possible to obtain decoded data in a correct way by handling both reliable and unreliable data bits in distinction from each other by using the results of the reliability determination. In other words, the likelihood data (which may be unreliable) obtained by the iterative decoding process can be used in later processes to obtain decoded data in a correct way, even when there is not sufficient reliability in hard-decisions that are made with respect to the likelihood data. Therefore, the number of times to repeat the decoding cycle in the iterative decoding process can be reduced.

Preferably, the reliability determination part outputs said result of reliability determination as flag data that is paired with said corresponding data bit.

Such a data readout device can easily supply, the result of reliability determination of whether each data bit is one obtained from the likelihood data within the predetermined range that is regarded as lacking sufficient reliability to make the hard-decision, to the error correcting decoder.

Preferably, the error correcting decoder may be configured in such a manner as to handle said data bit as erroneous data when said reliability determination part determines that said data bit is one obtained from said likelihood data within said predetermined range.

If this is the case, the error correcting decoder can obtain ex-ante information that notifies of possibly erroneous data bits without using onerous processes. Therefore, the error correcting decoder can correct a greater number of errors in the data bits.

Preferably, the error correcting decoder performs an ECC (Error Correcting Code) decoding operation, wherein said data bit determined as one obtained from said likelihood data within said predetermined range is handled as lost data to perform a process based on a loss correcting decoding method.

In general ECC decoding processes, maximum loss-correction lengths tend to be longer than maximum error-correction lengths. Therefore, as stated above, greater number of errors in data bits can be corrected by handling data bits determined as being obtained from likelihood data within the predetermined range as lost data.

Preferably, said reliability determination part employs two slice levels that define said predetermined range in order to determine whether each data bit is one obtained from said likelihood data within said predetermined range.

Such a data readout device can compare likelihood data with two slice levels as stated above, and can easily determine whether the likelihood data is within the predetermined range, based on the comparison results.

Preferably, the likelihood data generated by the iterative decoding process is a value in a continuously expressed numerical range corresponding to probabilities from the maximum probability of the data bit being 1 to the maximum probability of the data bit being 0, wherein the two slice levels comprise a first slice level that is larger than the median of the numerical range and a second slice level that is smaller than the median of the numerical range;

wherein the median of the numerical range is used as another slice level for making the hard-decision on the likelihood data.

The median of the continuous numerical range that represents the probabilities from the maximum probability of the data bit being "1" to the maximum probability of the data bit being "0" corresponds to a situation where the probability that the data bit being "1" is almost equal to the probability that the data bit being "0", therefore, it is used as the slice level for the hard-decision on the likelihood data to obtain the value of either "1" or "0" for the data bit. The first slice level (which is larger than the median) and the second slice level (which is smaller than the median) define the predetermined range of the likelihood data that are regarded as lacking sufficient reliability for the hard-decisions. Therefore, the predetermined range includes likelihood data where the probability of the data bit being "1" is almost equal to the probability of the data bit being "0".

The form of the likelihood data can be any type of value, as long as the value is within the continuous numeric range representing the probabilities from the maximum probability of the data bit being "1" to the maximum probability of the data bit being "0".

Preferably, the likelihood data generated by the iterative decoding process is a value in a continuously expressed numerical range corresponding to probabilities from the maximum probability of the data bit being 1 to the maximum probability of the data bit being 0, wherein the two slice levels comprise a first slice level that is larger than the median of the numerical range and a second slice level that is smaller than the median of the numerical range, wherein a hard-decision for deciding whether the data bit is 1 based on the first slice level and a hard-decision for deciding whether the data bit is 0 based on the second slice level are respectively performed, wherein the data bit as the hard-decision result corresponding to the likelihood data within the predetermined range defined by the first and second slice levels regarded as lacking sufficient reliability to make the hard-decision is set to a predetermined value of either 1 or 0.

Based on the results of the hard-decisions employing the first slice level and the second slice level, such a data readout device can decide the data bit (as either "1" or "0") and can determine whether the data bit is the one obtained from the likelihood data within the predetermined range whose corresponding hard-decision is regarded as lacking sufficient reliability.

The data bit as the hard-decision result corresponding to the likelihood data within the predetermined range regarded as lacking sufficient reliability due to the hard-decision is set to the predetermined value of either 1 or 0. Regardless of whether the hard-decision result corresponding to the likelihood data within the predetermined range regarded as lacking sufficient reliability due to the hard-decision is 1 or 0, the error correcting decoder performs its error correcting operation using the data that indicates insufficient reliability. Therefore, the capability of effecting accurate error-correction can be increased.

Preferably, the likelihood data generated by the iterative decoding process are log likelihood ratios defined based on ratios of the probability of the data bit being 1 and the probability of the data bit being 0.

In such a data readout device, if a positive value is assigned to the maximum probability of the data bit being "1", the maximum probability of the data bit being "0" takes a negative value, and the median of the numerical range becomes zero.

Preferably, with a view of providing a device that can perform decoding as correctly as possible under a variety of decoding conditions or recording conditions in data recording media, the data readout device may comprise a range-setting part that can set and adjust said predetermined range.

The range-setting part can perform a setting of the predetermined range where the likelihood data are regarded as lacking sufficient reliability for making the aforementioned hard-decisions, wherein the setting is performed based on data recording/storing conditions at the recording medium and/or decoding conditions.

When the number of times to repeat the decoding process becomes smaller, the likelihood data within the predetermined range (i.e., the likelihood data within the range where the hard decisions on the likelihood data are regarded as lacking sufficient reliability) tend to occur more frequently and, as a result, it becomes more difficult to perform a setting of a predetermined range of likelihood data so that hard-decisions on the of likelihood data are regarded as lacking sufficient reliability, under the condition in which the error correction part is capable of effecting error correction.

With this in mind, the data readout device may preferably comprise a controller that can substantially disable the function of said range-setting part when the number of times to repeat the decoding process in accordance with said iterative decoding method does not exceed a predetermined number.

The control by the control part discussed here to disable the range-setting function may be effected by totally disabling the function of the range-setting part in such a manner that the setting of the so-called predetermined range is not performed at all. Alternatively, in the case of a range-setting part employing a pair of slice levels to define the aforementioned predetermined range, the function of the range-setting part may be substantially disabled by setting slice levels to values that are equal to each other through the control from the control part.

In one aspect of the present invention, there is provided a method of reading out data from a data recording medium that stores encoded data encoded by a turbo-coding method, comprising the following steps:

a sampling step that obtains sampled values by performing sampling on signals from said recording medium;

an iterative decoding step that generates likelihood data from said sampled values by an iterative decoding method, wherein said iterative decoding method corresponds to said turbo-coding method;

a hard-decision step that obtains a data bit by performing a hard-decision on said likelihood data, a slice level setting step that sets a slice level that divides a predetermined distribution of likelihood data into a reliable range of likelihood data and an unreliable range of likelihood data;

a flag data generating step that generates flag data on said data bit by comparing said likelihood data used for obtaining said data bit with said slice level;

a choosing step that chooses one error correction method by making reference to said flag data, wherein said error correction method is selected from an error-check-and-correction method, and a loss-correction method, wherein said error-check-and-correction method comprises error checking and error correction, wherein said loss-correction method comprises loss-correction without performing error check; and a decoded data generating step that generates decoded data by performing error correction on data that include said data bit using said error correction method chosen in said choosing step.

Further, in another aspect of the present invention, there is provided a prerecorded program-storage medium storing a computer program, wherein when said computer program is executed in a computer, said computer program makes it possible for said computer to read out data stored on a data recording medium, said data encoded by a turbo-coding method;

wherein said computer program running on said computer reads out said data from said data recording medium in accordance with the following steps:

a sampling step that obtains sampled values by performing sampling on signals from said recording medium;

an iterative decoding step that generates likelihood data from said sampled values by an iterative decoding method, wherein said iterative decoding method corresponds to said turbo-coding method;

a hard-decision step that obtains a data bit by performing a hard-decision on said likelihood data, a slice level setting step that sets a slice level that divides a predetermined distribution of likelihood data into a reliable range of likelihood data and an unreliable range of likelihood data;

a flag data generating step that generates flag data on said data bit by comparing said likelihood data used for obtaining said data bit with said slice level;

a choosing step that chooses one error correction method by making reference to said flag data, wherein said error correction method is selected from an error-check-and-correction method, and a loss-correction method, wherein said error-check-and-correction method comprises error checking and error correction, wherein said loss-correction method comprises loss-correction without performing error check; and a decoded data generating step that generates decoded data by performing error correction on data that include said data bit using said error correction method chosen in said choosing step.

With these aspects of the present invention, even when there is not sufficient reliability in hard-decisions that decide data bits based on the likelihood data, it becomes possible to obtain decoded data in a correct way by handling both reliable and unreliable data bits in distinction from each other by using the flag data as the results of the reliability determination. In other words, the likelihood data (which may be unreliable) obtained by the iterative decoding process can be used in the choosing step to choose a suitable error correction method to effect error correction widely and rapidly to obtain decoded data in a correct way, even when there is not sufficient reliability in hard-decisions that are made with respect to the likelihood data. Therefore, the number of times to repeat the decoding cycle in the iterative decoding process can be reduced.

Other features that may be employed to help further achieve the objects together with the advantageous effects of the present invention will become apparent by reference to the following detailed description when considered in connection with the accompanying drawings.

BRIEF DESCRIPTION OF THE DRAWINGS

FIG. 11 is a logical operation table of the hard-decision section of FIG. 10;

DETAILED DESCRIPTION OF THE PREFERRED EMBODIMENTS

Now, an embodiment of the present invention is described in detail with reference to the attached drawings.

Figure 6:
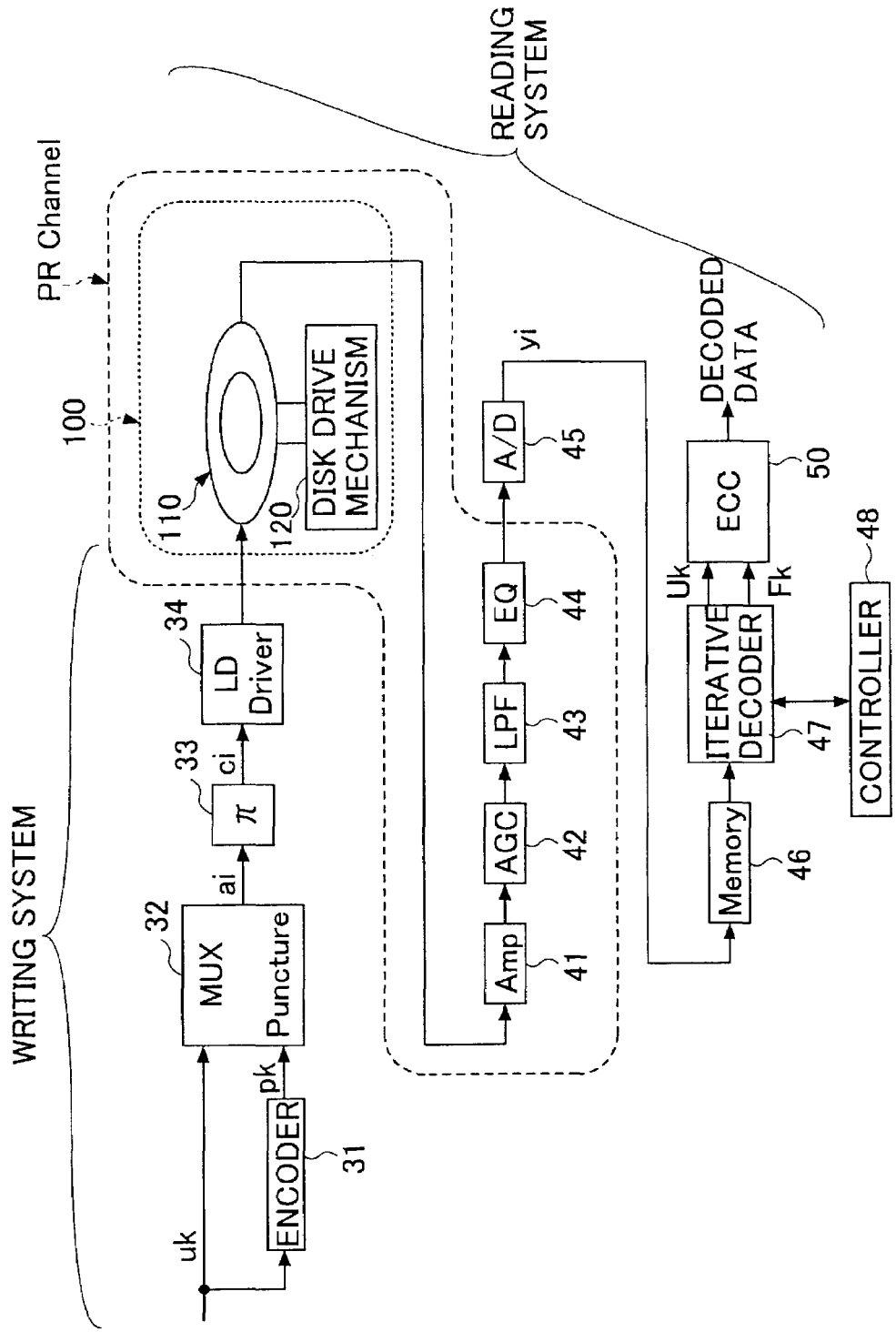
FIG. 6 is a block diagram showing a data readout device according to an embodiment of the present invention.

FIG. 6 shows a data readout device of an embodiment of the present invention. The data readout device is substantiated by a reading system of a data reader/writer unit that performs recording and reading of data.

More specifically, the data reader/writer unit shown in FIG. 6 is an optical disk reader/writer unit that employs a MO (Magneto-Optical) disk 110 as a recording medium. The data reader/writer unit is made up of a MO writing/reading mechanism 100, a writing system that writes data to the MO 110 and a reading system that reads out data from the MO 110. The above writing/reading mechanism 100 is made up of an optical beam emitter unit (for example, a LD (Laser Diode)), an optical head with a photo detector, and a disk driving mechanism 120 that rotates the MO 110 at a predetermined speed.

Figure 7:
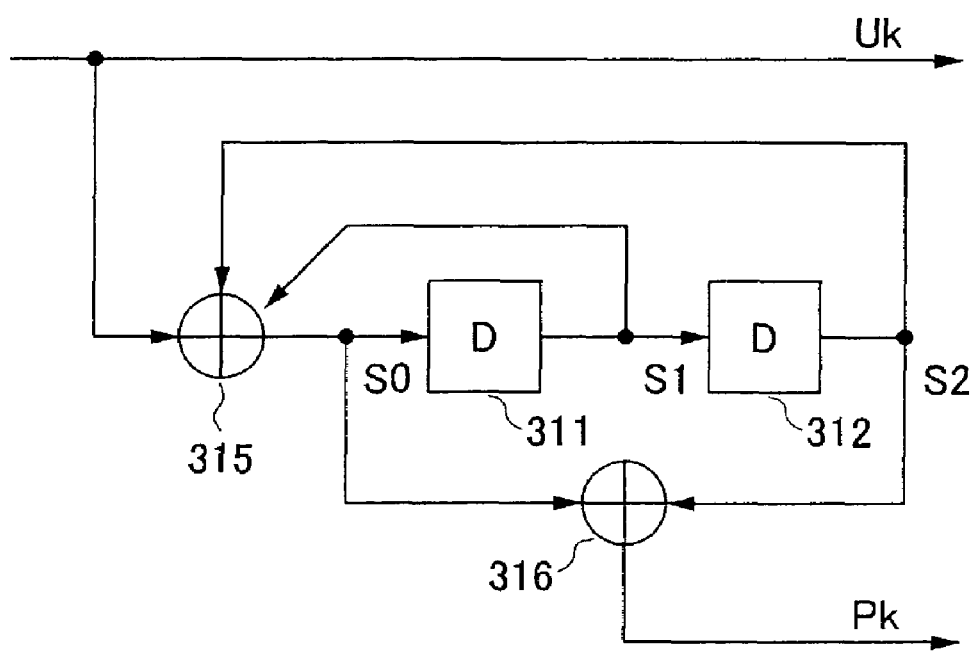
FIG. 7 is a block diagram illustrating an encoder of a writing system of the data readout device of FIG. 6.

The writing system is made up of an encoder 31, a coupler (multiplexer) 32, an interleaver 33 and a LD drive circuit 34. Illustratively, the encoder 31 is a recursive systematic convolutional coding device that is made up of two delay elements 311 and 312 and two XOR (exclusive OR) gates 315 and 316 as shown in FIG. 7. By encoding user data "uk" with the constraint length whose value is three, the encoder 31 generates a parity bit string "pk" that corresponds to the user data "uk".

The coupler 32 couples the user data "uk" with the parity bit string "pk" generated by the encoder 31 and thus a resulting bit string is produced. Then the coupler 32 performs a function (i.e., "puncture" function) by skipping some bits of the resulting bit string in accordance with a predetermined rule. This function generates a coded data bit string "ai". The interleaver "π" 33 generates a coded data bit string "ci" by changing the sequence of the bits of the coded data bit string "ai" from the coupler 32 in accordance with a predetermined rule.

The laser diode driver circuit 34 controls the operation of the optical beam emitting unit of the MO writing/reading mechanism 100 based on the coded data bit string "ci". Thus, signals are written on the MO disk 110 by optical beams from the optical beam emitting unit whose operation is controlled based on the coded data bit string "ci".

The writing of signals on the MO disk 110 is performed densely so as to cause a predetermined wave interference when the signals are read out.

Figure 1:
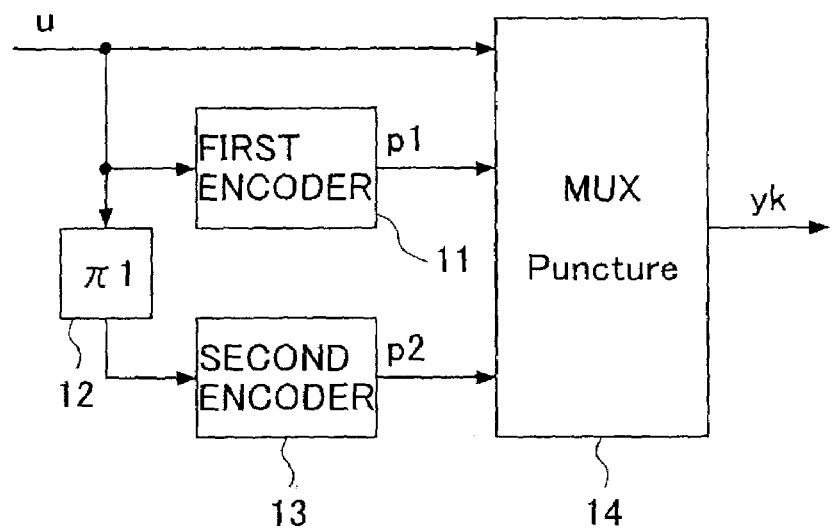
FIG. 1 is a block diagram showing a conventional turbo-coding device.
Figure 2:
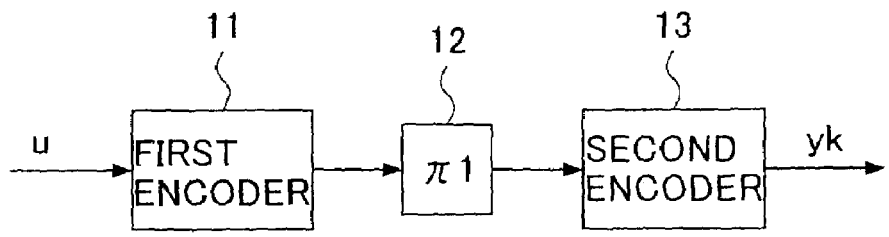
FIG. 2 is a block diagram showing another conventional turbo-coding device.

The reading system of the data reader/writer unit is made up of an amplifier 41, an AGC (Automatic Gain Controller) 42, a low-pass filter 43, an equalizer 44 and an A/D (Analog-to-Digital) converter 45. The amplifier 41, the AGC 42, the low-pass filter 43 and the equalizer 44 perform waveform shaping on MO readout signals output from the photo detector of the MO writing/reading mechanism 100 so as to obtain waveforms that can be regarded as PR (Partial Response) waveforms. In other words, the readout signals from the MO disk 110 are brought into a state substantially equal to that obtained by encoding at PR channels. Thus, such a virtual-PR-channel-encoding function together with the aforementioned writing system (the encoder 31) make it possible to configure a turbo-coding device that is shown in FIG. 2.

The reading system is made up of a memory unit 46, an iterative decoder 47, a controller 48 and an ECC decoding circuit 50. The signals that undergo the waveform equalization as stated above are converted to digital values (sampled values) at predetermined sampling periods with the A/D converter 45. Then, sampled values "yi" being output sequentially from the A/D converter 45 are stored in the memory unit 46. Then, the sampled values "yi" are read out from the memory unit 46, and are decoded (more specifically, by turbo decoding) at the iterative decoder 47. The controller 48 controls the decoding condition and the operation of the iterative decoder 47. The iterative decoder 47 performs the decoding process repeatedly and outputs a decoded data row "Uk" and a flag bit "Fk", wherein the flag bits "Fk" are respectively generated corresponding to respective data bits of the data row "Uk", which will be described in more detail later.

The ECC decoding circuit 50 generates finalized decoded data based on the data bit string "Uk" and the flag bit "Fk" (that are output from the iterative decoder 47 as stated above). This is done by performing error-correcting decoding operations in accordance with an ECC (Error Correcting Code). Further detailed operations of the ECC decoding circuit 50 are described later.

The iterative decoder 47 in the reading system includes decoders, which correspond to the combination of the encoder 31 and the PR-channel-encoding function as stated above. Such details of the iterative decoder 47 are illustrated in FIG. 8.

Figure 8:
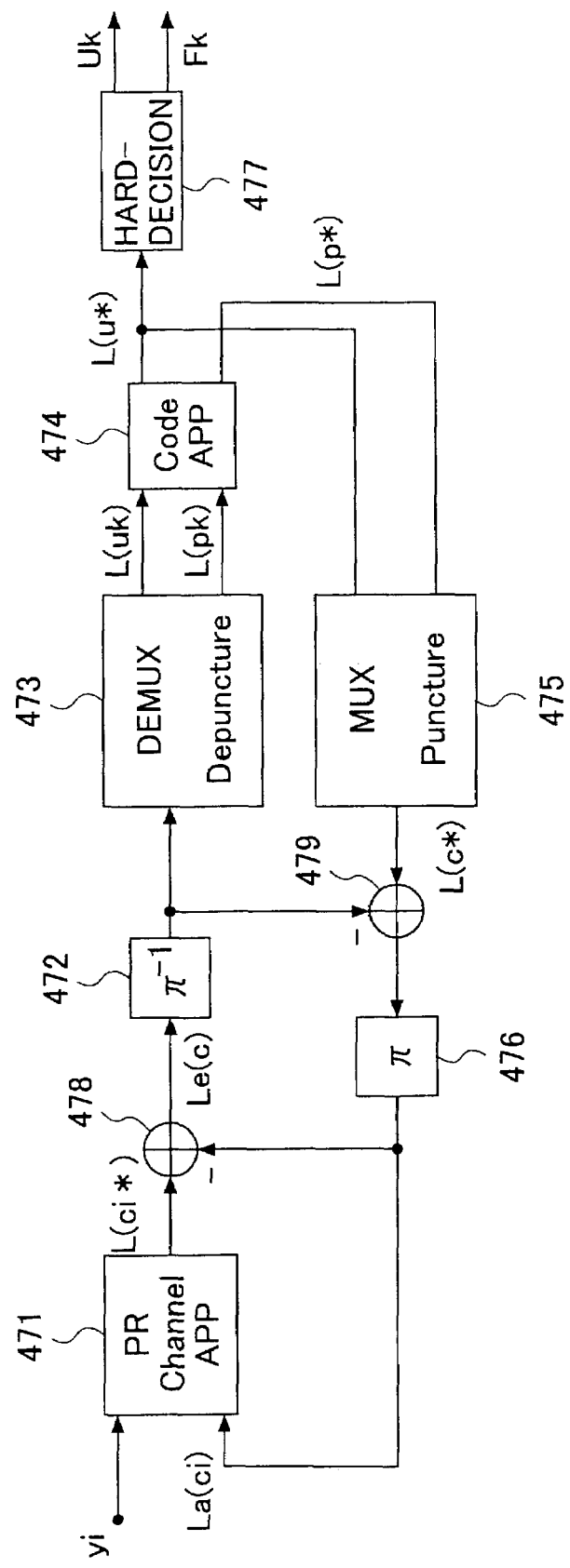
FIG. 8 is a block diagram illustrating an iterative decoder of a reading system of the data readout device of FIG. 6.

As shown in FIG. 8, the iterative decoder 47 includes a PR-channel decoder 471, a de-interleaver "$\pi^{-1}$" 472, a divider (de-puncturing demultiplexer) 473, a Code-decoder 474, a coupler (puncturing multiplexer) 475, an interleaver "$\pi$" 476 and a hard-decision section 477.

The PR-channel decoder 471 is the decoder that corresponds to the PR-channel-encoding function as stated above. The PR-channel decoder 471 performs APP (A Posteriori Probability) decoding. More specifically, under the condition that the input sampled values "Y" (y1, y2, . . . , yn) are detected, the PR-channel decoder 471 calculates the log likelihood ratios "L(ci*)" based on the ratios of the probability "P(ci=1|Y)" of the bit "ci" being "1" to the probability "P(ci=0|Y)" of the bit "ci" being "0" in accordance with the following formula:

$$L(ci^*)=ln\{P(ci=1|Y)/P(ci=0|Y)\} \quad (4)$$

Each of the above probabilities is calculated based on a trellis diagram that represents the state transition of the sampled value "yi", using a communication channel value constant "Lc".

Figure 4:
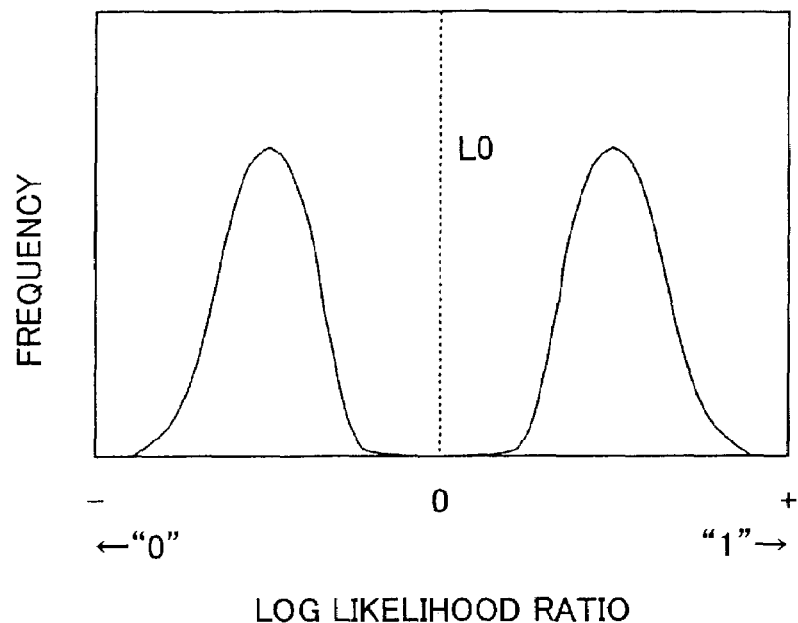
FIG. 4 is a histogram showing a frequency distribution curve of log likelihood ratios obtained by illustrative iterative decoding processes as an example.

Being calculated by the formula (4), the above log likelihood ratios "L(ci*)" take values that continuously correspond to a numerical range from a positive value "$L_{max}$" to a negative value "$L_{min}$" (more specifically, the range represented by the portion extending along the horizontal axis shown in FIG. 4 (or FIG. 5) between the point representing the maximum probability of the bit "ci" being "1" and the point representing the maximum probability of the bit "ci" being "0".

A subtracter 478 subtracts respective ex-ante data "La (ci)" (which are based on outputs from the Code-decoder 474 as stated above) from respective likelihood data L(ci*) output from the PR-channel decoder 471 and generates respective external likelihood data "Le(c)".

The resulting external likelihood data "Le(c)" sequentially obtained in a row are then processed by the de-interleaver "$\pi^{-1}$" 472 so as to change the sequence thereof and are thereafter supplied to the demultiplexer 473. The demultiplexer 473 divides (or demultiplexes) the row of the likelihood data (that are sequentially obtained as stated above) into a row of likelihood data "L(uk)" that correspond to data bits "uk" and a row of likelihood data "L(pk)" that correspond to parity bits "pk". In this dividing process, a de-puncturing function is also performed. The de-puncturing function brings about some additional data bits in accordance with a rule that corresponds to the rule used at the coupler 32 for the puncturing function (i.e., skipping of data bits in the encoding processes).

The Code-decoder 474 is the aforementioned decoder that corresponds to the encoder 31 of the writing system. The Code-decoder 474 also performs APP (A Posteriori Probability) decoding processes. More specifically, the Code-decoder 474 calculates log likelihood ratios "L(u*)" expressed using posterior probabilities on the data bits (i.e., the probability of the data bit "uk" being "1" and the probability of the data bit "uk" being "0") and also calculates log likelihood ratios "L(p*)" expressed using posterior probabilities on the parity bits (i.e., the probability of the parity bit "pk" being "1" and the probability of the parity bit "pk" being "0"). These calculations are carried out based on the likelihood data "L(uk)" related to the data bits as stated above and the ex-ante data "L(pk)" related to the parity bits.

A row of log likelihood ratios "L(u*)" sequentially output from the Code-decoder 474 and a row of log likelihood ratios "L(p*)" sequentially output from the Code-decoder 474 are supplied to the coupler 475. The coupler 475 combines (multiplexes) the row of log likelihood ratios "L(u*)" and the row of log likelihood ratios "L(p*)", and performs puncturing function (i.e., skipping of data) in accordance with a predetermined rule. As a result, likelihood data "L(c*)" are output from the coupler 475.

The communication channel value Lcxyi does not have to be considered in the Code-decoder 474. Therefore, likelihood data "L(c*)" obtained by combining the log likelihood ratios "L(u*)" and "L(p*)" can be expressed as the following formula:

$$L(c^*) = Le(c) + La(c) \quad (5);$$

wherein "Le(c)" stands for the ex-ante data and "La(c)" stands for the external likelihood data.

The ex-ante data "Le(c)" that have been output toward to the Code-decoder 474 and that have not yet been divided into "L(uk)" and "L(pk)" are subtracted from the likelihood data "L(c*)" by means of a subtracter 479. Thus, the external likelihood data "La(c)" are obtained.

The external likelihood data "La(c)" are converted to ex-ante data "La(ci)" for the PR-channel decoder 471 and the subtracter 478 by means of the interleaver "π" 476. Then the ex-ante data "La(ci)" are supplied to the PR-channel decoder 471 and the subtracter 478.

As stated above, in the iterative decoder 47 (that has the PR-channel decoder 471 and the Code-decoder 474), one of the decoders 471 and 474 performs decoding processes repeatedly (i.e., performs iterative decoding) using ex-ante data that are supplied from the other decoder.

When a predetermined number of the above stated iterative decoding processes are finished, the hard-decision section 477 decides whether the data bit "Uk" is "1" or "0" based on the log likelihood ratio "L(u*)" (on the data bit "uk") output from the Code-decoder 474. The hard-decision section 477 thus outputs the data bit "Uk" having the decided value. The hard-decision section 477 further generates a flag bit "Fk" that is indicative of the reliability of the hard-decision of each data bit "Uk". The hard-decision section 477 outputs the flag bit "Fk" together with the corresponding data bit "Uk".

Figure 5:
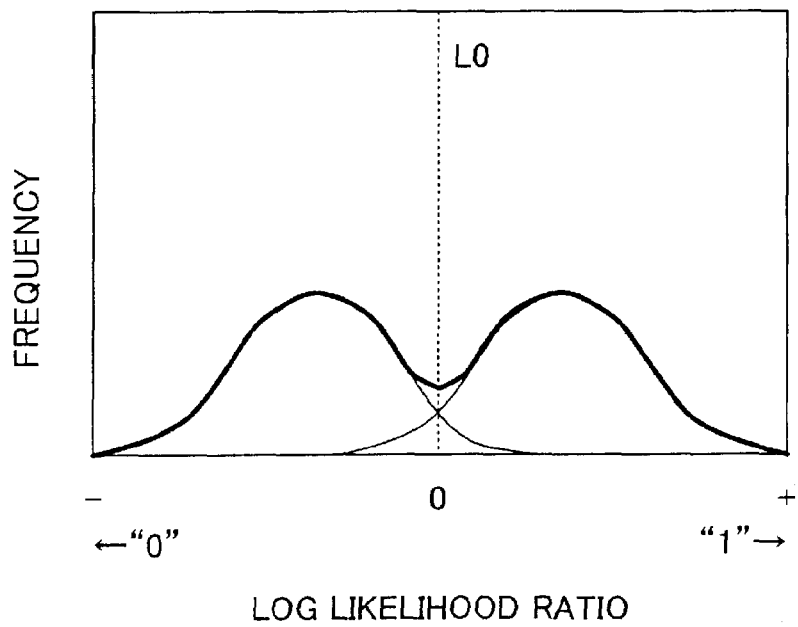
FIG. 5 is a histogram showing a frequency distribution curve of log likelihood ratios obtained by iterative decoding processes as another example.

Before going into further details of the hard-decision section 477, it should be noted that, when the data recording/reading SNR is poor or when the number of times to repeat the decoding process is not sufficiently large, the distribution of the log likelihood ratios "L(u*)" obtained by decoding random data tends to be like the distribution as shown in FIG. 5 (which means that the "+" side histogram (corresponding to log likelihood ratios where the probability of the data bit "Uk" being "1" is larger than the probability of the data bit "Uk" being "0") is not clearly separated from the "−" side histogram (corresponding to log likelihood ratios where the probability of the data bit "Uk" being "0" is larger than the probability of the data bit "Uk" being "1")). Under such circumstances, because log likelihood ratios "L(u*)" that take place in the neighborhood of the origin 0 mean the situation that the possibility of the data bit being "0" is close to the possibility of the data bit being "1", such log likelihood ratios "L(u*)" taking place in the neighborhood of the origin 0 cannot be used with sufficient reliability to establish that the data bit is "0" nor that the data bit is "1".

Figure 9:
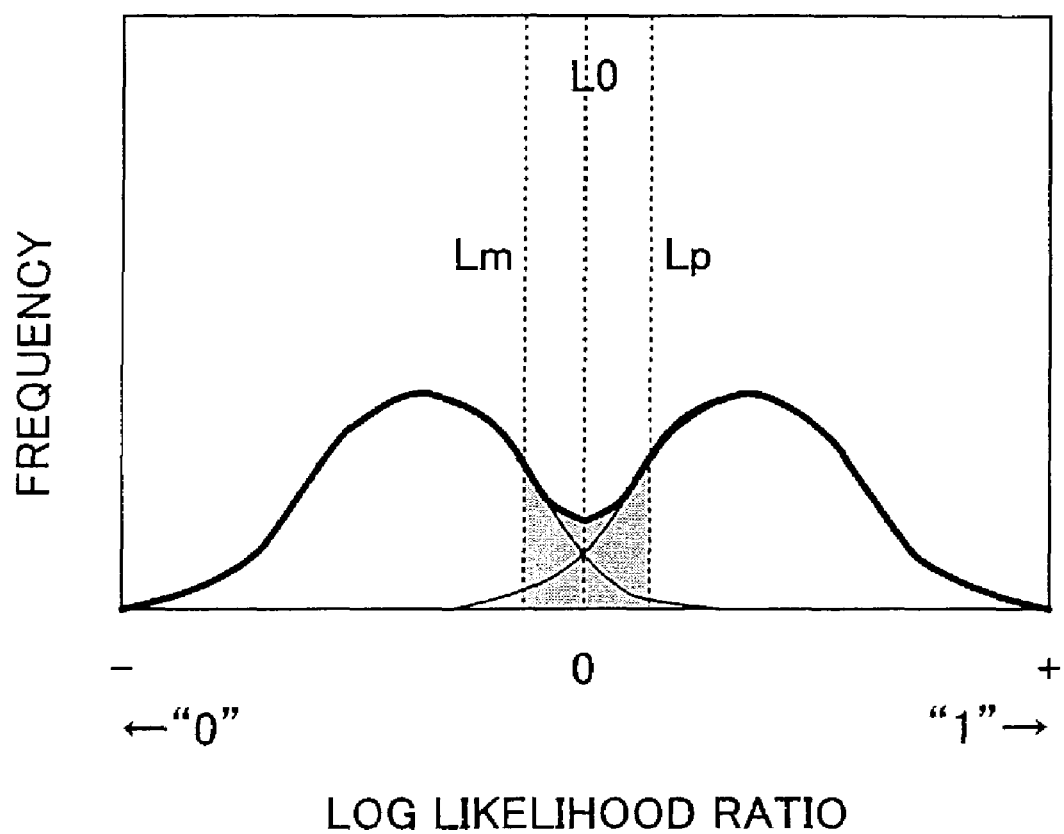
FIG. 9 is a diagram schematically showing slice levels that are used in a hard-decision section.

Therefore, as shown in FIG. 9, the hard-decision section 477 performs hard-decisions on log likelihood ratios "L(u*)" by using two slice levels Lp and Lm that define a predetermined range in the neighborhood of the origin 0. The hard-decision section, 477 further generates flag bits "Fk". Each of these flag bits "Fk" shows whether each hard-decision result "Uk" corresponds to a log likelihood ratio "L(u*)" that is within the above predetermined range defined by the two slice levels "Lp" and "Lm". In this manner, the hard-decision section 477 outputs the flag bits "Fk" with respective hard-decision results "Uk".

Figure 10:
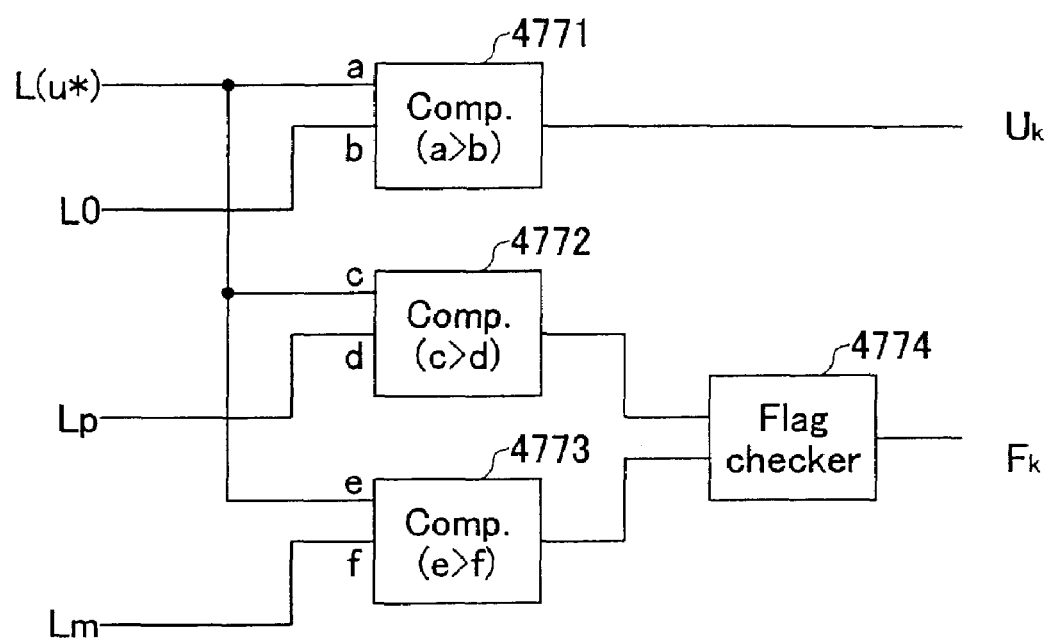
FIG. 10 is a block diagram illustrating a hard-decision section of the reading system of the data readout device of FIG. 6.

FIG. 10 shows an illustrative detailed configuration of the hard-decision section 477. The hard-decision section 477 is made up of a first comparator 4771, a second comparator 4772, a third comparator 4773 and a flag checker circuit 4774. The hard-decision section 477 decides values of the detected data "Uk" and values of the flag bits "Fk" in accordance with the logical operation table shown in FIG. 11.

The first comparator 4771 compares each log likelihood ratio "L(u*)" (i.e., input value "a") with the slice level "L0" located at the origin 0 (which is input as input value "b"). When the log likelihood ratio "L(u*)" is larger than the slice level L0 (i.e., when "a>b"), the first comparator 4771 makes a "true" decision and outputs "1" as the decided data bit "Uk". Otherwise (when "a<=b"), the first comparator 4771 makes a "fail" decision and outputs "0" as the decided data bit "Uk".

The second comparator 4772 compares each log likelihood ratio "L(u*)" (input value "c") with the slice level Lp (input value "d") that is larger than the slice level L0. When the log likelihood ratio "L(u*)" is larger than the slice level Lp (i.e., when "c>d"), the second comparator 4772 makes a "true" decision output. Otherwise (when "c<=d"), the second comparator 4772 makes a "fail" decision output. The third comparator 4773 compares each log likelihood ratio "L(u*)" (input value "e") with the slice level Lm (input value "f") that is smaller than the slice level L0. When the log likelihood ratio "L(u*)" is larger than the slice level Lm (i.e., when "e>f"), the third comparator 4773 makes a "true" decision output. Otherwise (when "e<=f"), the third comparator 4773 makes a "fail"-decision output.

The flag checker circuit 4774 decides the value of the flag bit "Fk" based on the decision output from the second comparator 4772 and on the decision output from the third comparator 4773. More specifically, when both the second comparator 4772 and the third comparator 4773 simultaneously output "true"-decisions, the flag checker circuit 4774 outputs "0" as the flag bit "Fk". Also, when both the second comparator 4772 and third comparator 4773 simultaneously output "fail" decisions, the flag checker circuit 4774 outputs "0" as the flag bit "Fk". On the other hand, when the second comparator 4772 outputs a "fail" decision and the third comparator 4773 simultaneously outputs a "true" decision, the flag checker circuit 4774 outputs "1" as the flag bit "Fk".

A situation where a "true" decision is output from the second comparator 4772 and a "true" decision is simultaneously output from the third comparator 4773 cannot happen. This is because of the relationships between the slice levels Lm, L0 and Lp shown in FIG. 9 (Lm<L0<Lp). Also, a situation where the first comparator 4771 is outputting "1" as the decided data "Uk" while both the second comparator 4772 and the third comparator 4773 are simultaneously outputting "fail" decisions cannot happen. Also, a situation where the first comparator 4771 is outputting "0" as the decided data "Uk" while both the second comparator 4772 and third comparator 4773 are simultaneously outputting "true" decisions cannot happen.

To be more precise, these situations "could" happen if the hard-decision section 477 were configured as an asynchronous circuit and/or configured out of sync to cause or allow delayed actions within the circuit thereof. However, in this embodiment, the hard-decision section 477 is made up of synchronous type of circuits and is thus a synchronous circuit, as is usual for hard-decision circuits. This is why occurrence of the above situations does not have to be considered.

Since the hard-decision section 477 performs decision processes in accordance with the above logical operations (as shown in FIG. 11), when the log likelihood ratio "L(u*)" from the Code-decoder 474 satisfies the condition "L(u*)>Lp>L022 Lm", the hard-decision section 477 outputs "1"

as the decided data bit "Uk" and outputs "0" as the flag bit "Fk". When this is the case, the outputs show that "Uk=1" is established about the decided data bit "Uk" with relatively high reliability.

When the log likelihood ratio "L(u*)" from the Code-decoder 474 satisfies the condition "L(u*)<=Lm<L0<Lp", the hard-decision section 477 outputs "0" as the decided data "Uk" and outputs "0" as the flag bit "Fk". When this is the case, the outputs shows that the decided data bit "Uk" is established as "Uk=0" with relatively high reliability.

On the other hand, when the log likelihood ratio "L(u*)" from the Code-decoder 474 satisfies the condition "L0<L(u*)<=Lp", the hard-decision section 477 outputs "1" as the decided data bit "Uk" and outputs "1" as the flag bit "Fk". When this is the case, the outputs show that the decided value "1" of the data bit "Uk" lacks sufficient reliability for final use.

When the log likelihood ratio "L(u*)" from the Code-decoder 474 satisfies the condition "Lm<L(u*)<=L0", the hard-decision section 477 outputs "0" as the decided data bit "Uk" and outputs "1" as the flag bit "Fk". When this is the case, the outputs show that the decided value of the data bit "Uk" is "0" but that it lacks sufficient reliability for final use.

Figures 12, 13:
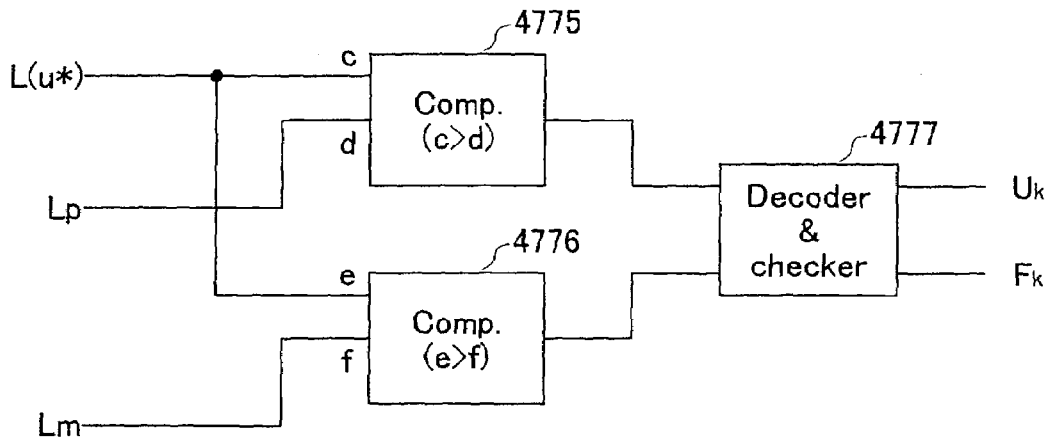
FIG. 12 is a block diagram illustrating a hard-decision section that is a variant of the hard-decision section of FIG. 10.
FIG. 13 is a logical operation table of the hard-decision section of FIG. 12.

As is true for these two cases, when the log likelihood ratio "L(u*)" from the Code-decoder 474 satisfies the condition "Lm<L(u*)<=Lp", the decided value of the data bit "Uk" decided based on the slice level L0 lacks sufficient reliability. In this case, therefore, it does not matter whichever of a "1" or "0" the decided value of the data bit is. From such a point of view, in this case, and with appropriate modifications to this embodiment, the detected data "Uk" and the flag bit "Fk" can be decided by using only two slice levels "Lm" and "Lp" that are set in the neighborhood of the origin 0. The modifications may include, for example, replacing the above hard-decision section 477 with a variant hard-decision section 477a that is configured as illustrated in FIG. 12. This hard-decision section 477a is made up of a first comparator 4775, a second comparator 4776 and a decoder/checker circuit 4777, and decides the detected data "Uk" and the flag bit "Fk" in accordance with a logical operation table shown in FIG. 13.

The first comparator 4775 in FIG. 12 operates similarly as the aforementioned comparator 4772 of FIG. 10. More specifically, the first comparator 4775 compares each log likelihood ratio "L(u*)" (input value "c") with the slice level Lp (input value "d") that is larger than zero (the abscissa of the origin 0). When the log likelihood ratio "L(u*)" is larger than the slice level Lp (i.e., when "c>d"), the first comparator 4775 makes a "true"-decision output. Otherwise (when "c<=d"), the first comparator 4775 makes a "fail"-decision output. The second comparator 4776 in FIG. 12 operates similarly as the aforementioned comparator 4773 of FIG. 10. More specifically, the second comparator 4776 compares each log likelihood ratio "L(u*)" (input value "e") with the slice level Lm (input value "f") that is smaller than zero (the abscissa of the origin 0). When the log likelihood ratio "L(u*)" is larger than the slice level Lm (i.e., when "e>f"), the second comparator 4776 makes a "true"-decision output. Otherwise (when "e<=f"), the second comparator 4776 makes a "fail"-decision output.

The decoder/checker circuit 4777 decides the value of the flag bit "Fk" based on the decision output from the first comparator 4775 and on the decision output from the second comparator 4776. More specifically, when both the first comparator 4775 and second comparator 4776 simultaneously output "true" decisions, the decoder/checker circuit 4777 outputs "1" as the decided data bit "Uk" and outputs "0" as the flag bit "Fk". When both the first comparator 4775 and second comparator 4776 simultaneously output "fail"-decisions, the decoder/checker circuit 4777 outputs "0" as the decided data bit "Uk" and outputs "0" as the flag bit "Fk".

When the first comparator 4775 outputs a "fail" decision and the second comparator 4776 simultaneously outputs a "true" decision, the decoder/checker circuit 4777 outputs "1" as the flag bit "Fk" and also outputs a predetermined value (for example, "1") as the decided data bit "Uk".

A situation where a "true" decision is output from the first comparator 4775 and a "fail" decision is simultaneously output from the second comparator 4776 cannot happen. This is because of the relationship between the slice levels Lm and Lp shown in FIG. 9 (Lm<Lp).

Since the hard-decision section 477a performs decision processes in accordance with the above logical operations (as shown in FIG. 13), when the log likelihood ratio "L(u*)" from the Code-decoder 474 satisfies the condition "L(u*)>Lp>Lm", the hard-decision section 477a outputs "1" as the decided data bit "Uk" and outputs "0" as the flag bit "Fk".

When the log likelihood ratio "L(u*)" from the Code-decoder 474 satisfies the condition "L(u*)<=Lm<Lp", the hard-decision section 477a outputs "0" as the decided data bit "Uk" and outputs "0" as the flag bit "Fk". When this is the case ("Fk=0"), the outputs shows that the detected data bit "Uk" is established as "Uk=0" with relatively high reliability.

On the other hand, when the log likelihood ratio "L(u*)" from the Code-decoder 474 satisfies the condition "Lm<L(u*)<=Lp", the hard-decision section 477a outputs "1" (a predetermined value) as the decided data "Uk" and outputs "1" as the flag bit "Fk". When this is the case ("Fk=1"), the outputs show that the decided value of the data bit "Uk" is "1" but that there is not sufficient reliability for establishing it.

As shown in FIG. 6, each pair of the decided data bit "Uk" and the flag bit "Fk" obtained by the aforementioned hard-decision processes in the hard-decision section 477 (or alternatively, each pair of the decided data bit "Uk" and the flag bit "Fk" obtained by the aforementioned hard-decision processes in the hard-decision section 477a) are supplied from the hard-decision section (477 or 477a, not shown in FIG. 6) of the iterative decoder 47 to the ECC decoding circuit 50. The ECC decoding circuit 50 performs an error-correction decoding process based on the decided data "Uk" and the flag bit "Fk" in order to generate decoded data.

The ECC decoding circuit 50 has an error-correction function and a loss-correction function. The error-correction function detects error bits by performing parity checks and corrects the detected error bits. The loss-correction function corrects error bits that are known in advance (i.e., lost data). Thus, the loss-correction function does not have to include detecting of error bits. Therefore, in general, the maximum bit length of correctable lost data is larger than the maximum bit length of correctable error data. Since the ECC decoding circuit 50 receives the aforementioned pair of flag bit "Fk" and decided data bit "Uk"), when the received flag bit "Fk" of the pair is "1" (which means that the received decided data bit "Uk" of the same pair was decided without sufficient reliability), the ECC decoding circuit 50 handles the decided data bit "Uk" as a lost data bit. As a result, the ECC decoding circuit 50 performs error correction (using the error-correction function) on decided data bits "Uk" that correspond to flag bits "Fk" whose values are "0"), and performs loss correction (using the loss-correction function) on decided data bits "Uk" that correspond to flag bits "Fk" whose values are "1").

Figure 14:
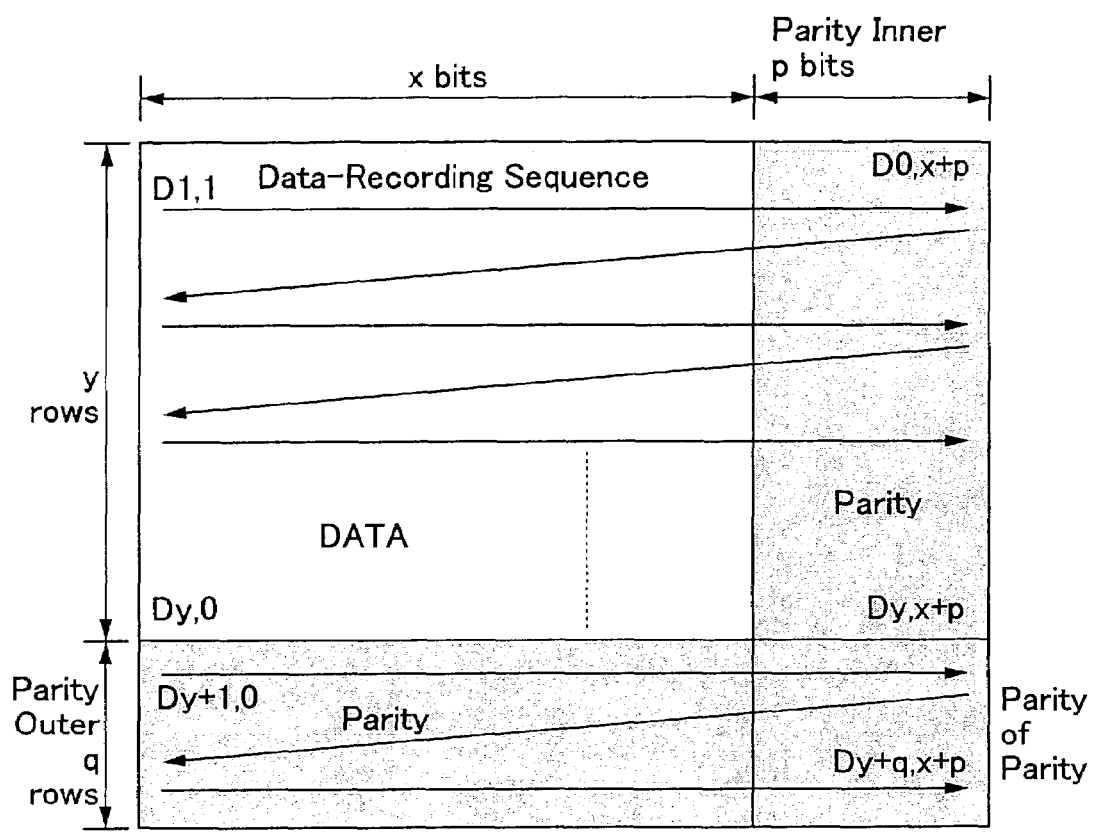
FIG. 14 is a diagram illustrating a data structure of recorded data that is constructed when a product code method is employed in an ECC coding process.

FIG. 14 shows an illustrative data structure of recorded data employing a product code for the ECC. In this data structure, "p" bits of parity bits have been added per "x" bits of original data (in the inner direction, i.e., to the right of the "x" bits in FIG. 14) and "q" rows of parity bits have been added per "y" rows (in the outer direction, i.e., under the "y" rows shown in the figure). A string of data bits that is configured in this manner is recorded into a track of the MO disk 110 sequentially from its first bit "D1,1" to its last bit "$D_{y+q,x+p}$" along the directional arrows shown in the figure. The amount of parity ("p" bits, "q" rows) added here depends on the amount of data ("x" bits, "y" rows). The maximum amount of correctable burst and the maximum number of correctable errors vary depending on the amount of parity. Discussed below is an illustrative case where data have been recorded using a product code in such a manner that, in each direction (of the inner and outer directions), the maximum bit length of correctable error data is two bits and the maximum bit length of correctable lost data is three bits.

Figure 3:
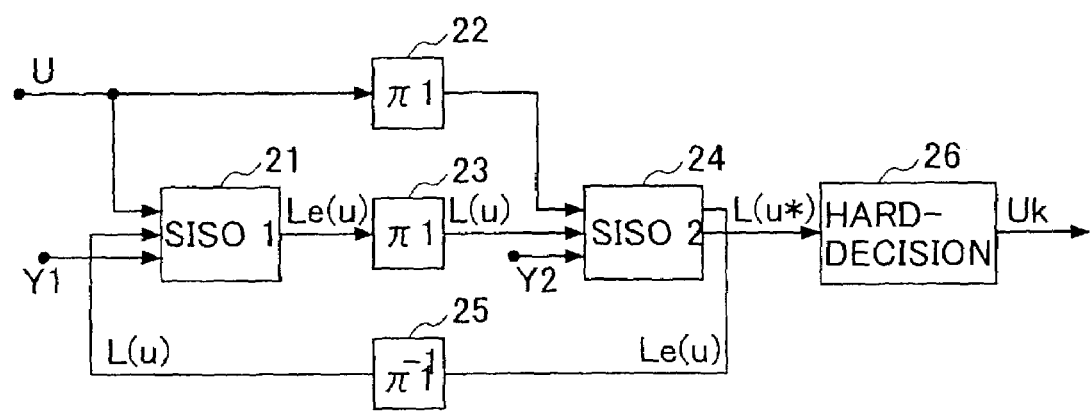
FIG. 3 is a block diagram showing a decoder corresponding to the turbo-coding device of FIG. 1.

Referring to FIG. 3, which is for comparison purpose here, when decided data from a hard-decision section of the conventional decoder of FIG. 3 contain totally nine error bits that extend for the length of three bits in series in each of the inner and outer directions, with a condition that the maximum bit length of correctable error data is two bits in its ECC circuit, the ECC circuit cannot correct the error bits in the inner direction and cannot correct the error bits in the outer directions.

Figure 15A:
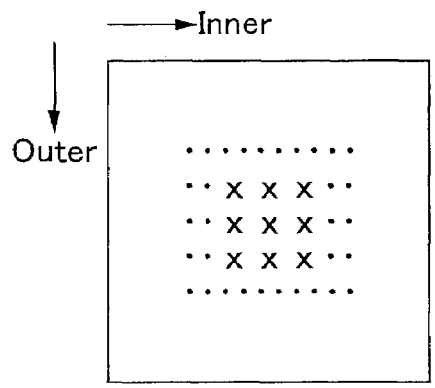
FIGS. 15A through 15C show relationships between illustrative error statuses and corresponding operability of error correction operations in ECC-decoding circuits according to the present invention (error correction is not operable in the case of FIG. 15A, and is operable in the cases of FIGS. 15B and 15C)
Figure 15B:
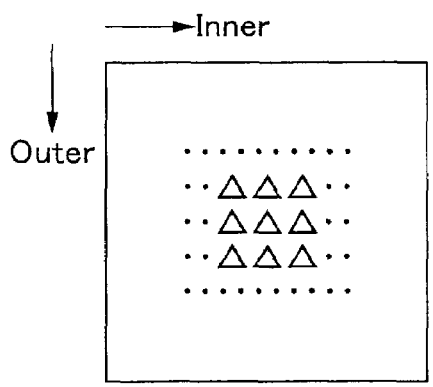

In contrast, with the hard-decision section 477 (or 477a) of the iterative decoder 47 of the present invention, data bits decided based on log likelihood ratios in the neighborhood of zero lack sufficient reliability (and are likely to be erroneous) but each of such data bits is provided with a corresponding flag bit "Fk" whose value is "1". Thus, when decided data at the hard-decision section contain totally nine error bits extending for the length of three bits in series in each of the inner and outer directions as shown in FIG. 15A, it is highly probable that the nine error bits will be handled as lost-data whose corresponding flag bits "Fk" satisfy the condition "Fk=1" in the ECC decoding circuit 50. In such cases, the ECC decoding circuit 50 is capable of correcting the lost data in both the inner and outer directions, with the maximum bit length of-correctable lost data in the decoding circuit 50 being three bits.

Figure 15C:
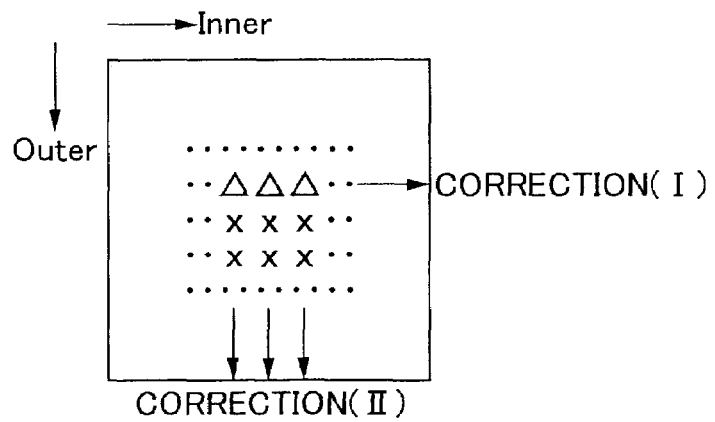

The decided data bits "Uk" established with relatively high reliability (i.e., those provided with flag bits satisfying "Fk=0") are not necessarily free of errors, especially when the slice levels used in the hard-decision section 477 (or 477a) are not suitable. Trying to cope with such cases, when three bits of data in a row in the inner direction shown in FIG. 15C are detected as lost data (i.e., with corresponding flag bits satisfying "Fk=1"), then the ECC decoding circuit 50 (whose maximum bit length of correctable lost data is three bits) can correct the three data bits handled as lost data by performing the following step (I) and then can correct the remaining six error bits by performing the following step (II).

In step (I), the ECC decoding circuit 50 (whose maximum bit length of correctable lost data is three bits) performs loss correction on the three data bits handled as lost data in a row in the inner direction.

In step (II), the ECC decoding circuit 50 (whose maximum bit length of correctable error data is two bits) performs error correction for three times wherein the error correction each time corrects two error bits in each column in the outer direction.

In short, in each data readout device of the above embodiment of the present invention, each decided data bit not established as having sufficient reliability at the hard-decision section 477 (or 477a) of the iterative decoder 47 (which is therefore relatively likely to be erroneous) is provided with a flag bit "Fk=1". Then, the ECC decoding circuit 50 handles the decided data bit that corresponds to the flag bit "Fk=1" in the same manner as it can handle a lost data bit. Thus, one of ordinary skill in the art would clearly understand that each data readout device of the above embodiment of the present invention is specifically effective in increasing the probability of correcting some types of error bits that the conventional data readout devices cannot correct at all. Consequently, such readout device (as an overall system including the iterative decoding process and the ECC decoding process) of the above embodiment of the present invention has an improved data-correction ability.

Further, when the decoding process is repeated for a relatively small number of times, there may be a data bit obtained by a hard-decision made without sufficiently reliable establishment based on a log likelihood ratio (which is a result of a soft decision) obtained by the repeated decoding processes. In such cases, the ECC decoding circuit 50 can efficiently process the data bit by handling it as a lost data bit. Therefore, the decoding time delay that is required for the whole system can be reduced.

Further, it should be noted that the frequency distribution curve (i.e., histogram) of the log likelihood ratios "L(u*)" (which are results of soft-decisions) varies depending on the recording condition at the recording medium and depending on the number of repetitions of the decoding process. When the histogram of the log likelihood ratios "L(u*)" varies, the optimum values of the slice levels "Lp" and "Lm" used for conducting hard-decisions on the log likelihood ratios "L(u*)" also vary. In view of this, the controller 48 makes or adjusts settings of the slice levels "Lp" and "Lm" used for the above hard-decisions at predetermined occasions (for example, when starting to read out data or when making a retry to read out data).

The slice level setting process performed by the controller 48 is conducted in accordance with the following particulars.

Figure 16:
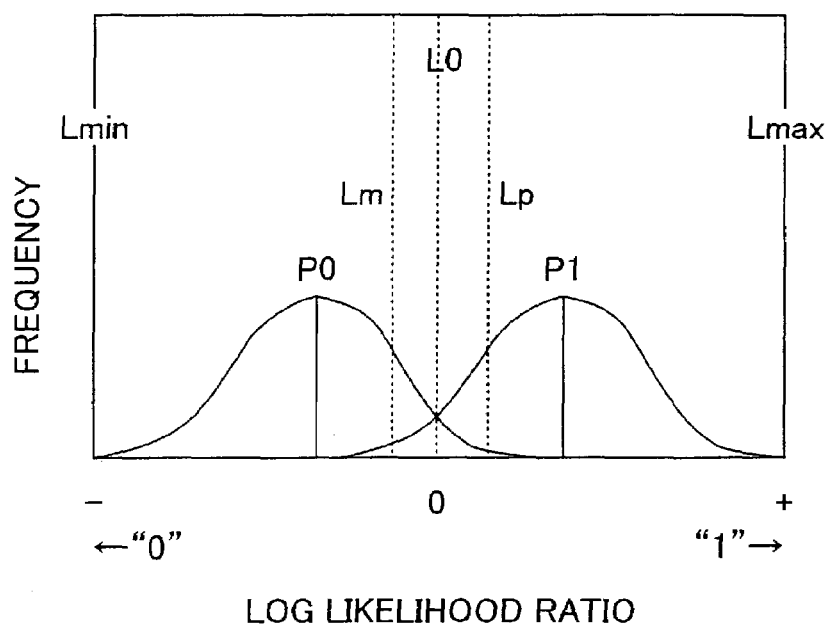
FIG. 16 is a diagram specifically showing an illustrative setting of slice levels (relative to the distribution curve of the log likelihood ratios) that are used in the hard-decision section of the present invention.

First, illustratively, the controller 48 generates a histogram of the log likelihood ratios "L(u*)" obtained by the iterative decoder 47 when random data recorded in a predetermined region of the recording medium (the MO disk 110) are read out. Then, as shown in FIG. 16, values of the two slice levels "Lp" and "Lm" are determined based on respective values "P0" and "P1" of log likelihood ratios that correspond to respective frequency peaks of the histogram.

Figure 17:
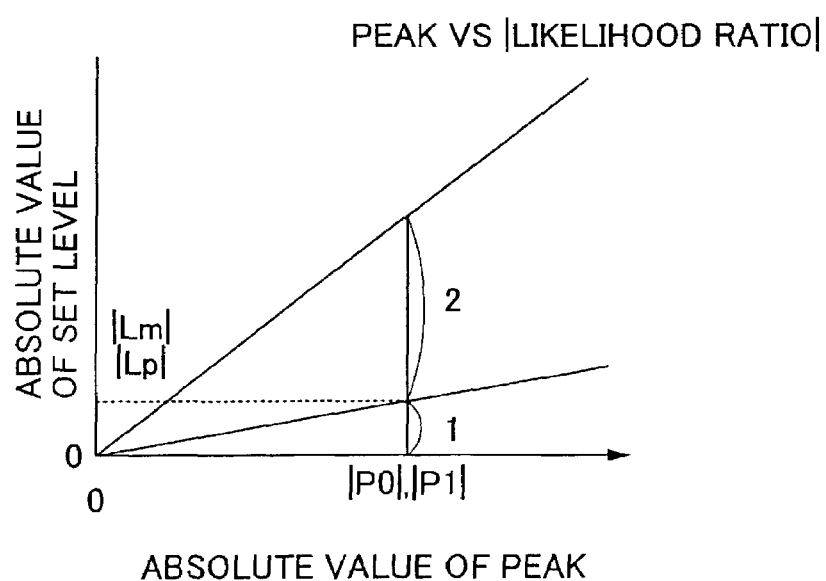
FIG. 17 is an explanatory drawing to show how the slice levels "Lp" and "Lm" of FIG. 16 are calculated.

More specifically, as shown in FIG. 17, respective slice levels "Lp" (a positive value) and "Lm" (a negative value) are set in such a manner that respective absolute values of the slice levels |Lp| and |Lm| are one third of the respective absolute values (|P0| and |P1|) of the log likelihood ratios ("P0" and "P1") that correspond to the respective peaks.

Figure 18:
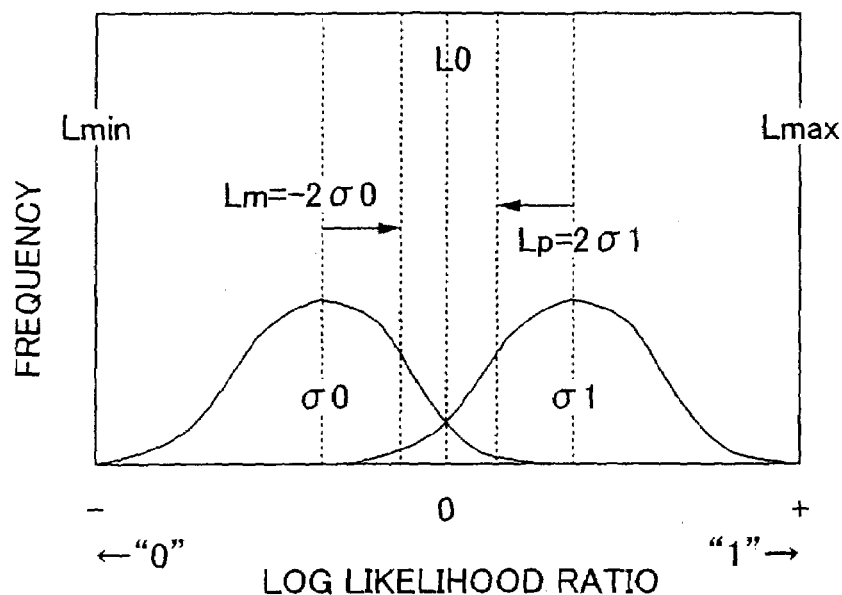
FIG. 18 is a diagram specifically showing another illustrative setting of slice levels (relative to the distribution curve of the log likelihood ratios) that are used in the hard-decision section of the present invention.

Alternatively, as shown in FIG. 18, slice levels "Lp" and "Lm" may be set wherein the respective slice levels "Lp" and "Lm" are calculated using standard deviations "$\sigma_1$" and "$\sigma_0$" with respect to the histogram of the log likelihood ratios "L(u*)" obtained as stated above. The details of these calculations are described below.

Figure 19:
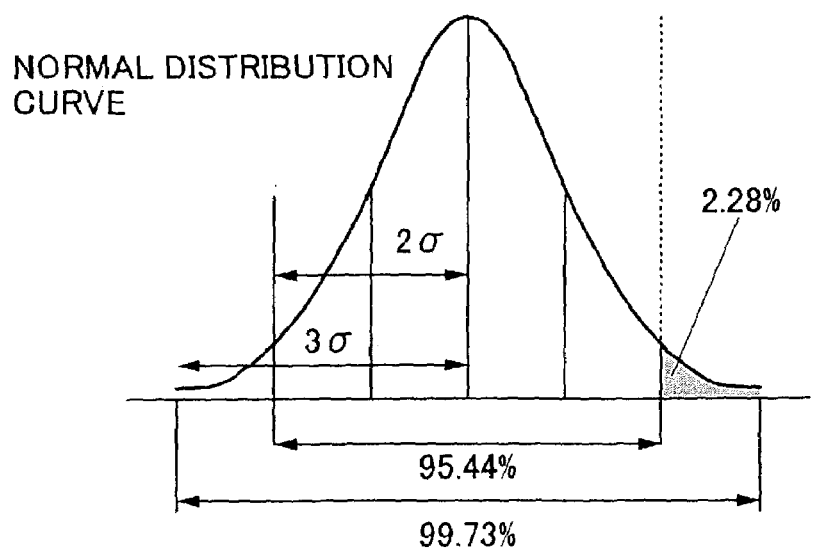
FIG. 19 is an explanatory drawing to show how the slice levels "Lp" and "Lm" of FIG. 18 are calculated.

First, for a normal distribution curve (shown in FIG. 19) having the standard deviation "σ" and the mean value of sampled values at its center, it is known as a mathematic fact that 95.44 percent of the overall samples fall within the plus/minus "$2\sigma$" range about the center of the normal distribution curve and that 99.73 percent of the overall samples fall within the plus/minus "$3\sigma$" range about the center. Therefore, assuming that the above histogram of the log likelihood ratios "$L(u^*)$" shows a normal distribution curve, for instance, 2.28 percent of all the data bits obtained by the hard-decisions can be provided with respective flag bits whose values "Fk" are "1", by setting the slice level "Lp" at a position "$2\sigma$" (or "Lm" at a position "$-2\sigma$").

In view of this, and turning to FIG. 18, assuming that the histogram of the log likelihood ratios "$L(u^*)$" whose mean value is located in the positive side is a normal distribution curve whose standard deviation is "$\sigma_1$", the controller 48 may be configured so as to set the slice level "Lp" to a value that corresponds to a position spaced apart from the mean value by "$2\sigma_1$" toward the slice level "L0" (=0). Similarly, assuming that the histogram of the log likelihood ratios "$L(u^*)$" whose mean value is located in the negative side is a normal distribution curve whose standard deviation is "$\sigma_0$", the controller 48 may be configured so as to set the slice level "Lm" to a value that corresponds to a position spaced apart from the mean value by "$2\sigma_0$" toward the slice level "L0" (=0).

With these settings of slice levels "Lp" and "Lm", for example, when a 2-kilobyte-format recording medium is used, approximately 746 bits (=4.568 percent of the capacity of the medium) will become those data bits that cannot be established due to lack of sufficient reliability (i.e., data bits decided by hard-decisions that are relatively likely to be erroneous). This amount of data bits can be sufficiently corrected in ECC decoding processes.

When the slice levels "Lp" and "Lm" are set by using "$3\sigma_1$" and "$3\sigma_0$" instead of "$2\sigma_1$" and "$2\sigma_0$" of the above example (with a 2-kilobyte-format recording medium), approximately 44 bits (=0.27 percent of the capacity of the medium) becomes data bits that cannot be established due to lack of sufficient reliability (i.e., data bits that are relatively likely to be erroneous). This amount of data bits can be sufficiently corrected in FCC decoding processes.

Figure 20:
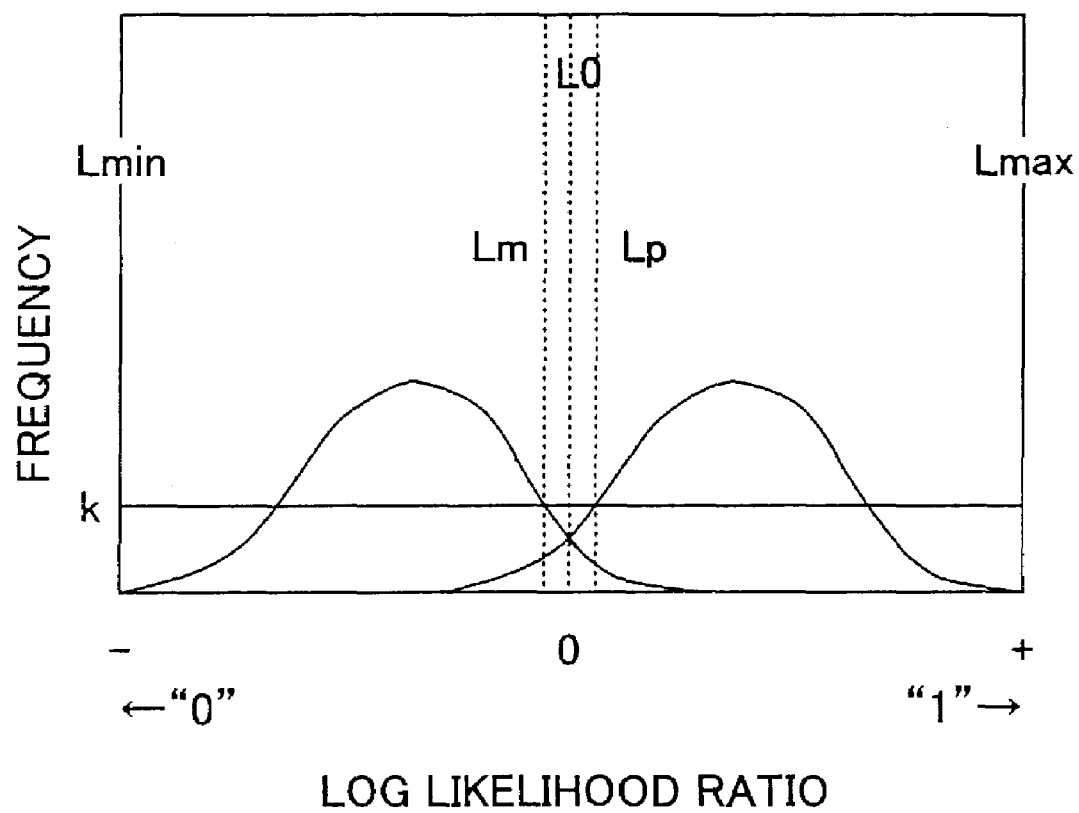
FIG. 20 is a diagram specifically showing still another illustrative setting of slice levels (relative to the distribution curve of the log likelihood ratios) that are used in the hard-decision section of the present invention, also showing how the slice levels "Lp" and "Lm" are calculated.

Further, as shown in FIG. 20, values of log likelihood ratios "$L(u^*)$" that correspond to a predetermined frequency "k" in the histogram are determined. Then, the slice levels "Lp" and "Lm" may be set to two of these values, respectively.

More specifically, the slice level "Lp" is set to a positive value that is closer to zero than the other positive value among two positive values that correspond to the frequency "k" in the histogram of the log likelihood ratios. The slice level "Lm" is set to negative a value that is closer to zero than the other negative value among two negative values that correspond to the frequency "k" in the histogram of the log likelihood ratios.

The above frequency "k" is predetermined based on the format of the record medium and the type of ECC decoding method (since the error-correction decoding ability varies depending on the type of ECC method).

It should be also noted that the distribution curve of the log likelihood ratios "$L(u^*)$" varies depending on the number of repetitions of the decoding process. More specifically, as the number of repetitions increases, the probability of a decided data bit "1" being correct increases and also the probability of a decided data bit "0" being correct increases, therefore, absolute values of the log likelihood ratios on decided data bit "1" tend to increase (i.e., the likelihood ratios tend to move away from the center value, zero), and therefore, the positive side distribution and the negative side distribution tend to be separated from each other.

Therefore, as shown in FIG. 21, the slice levels "Lp" and "Lm" can be set based on the number of repetitions to repeat the decoding process.

Figure 21A:
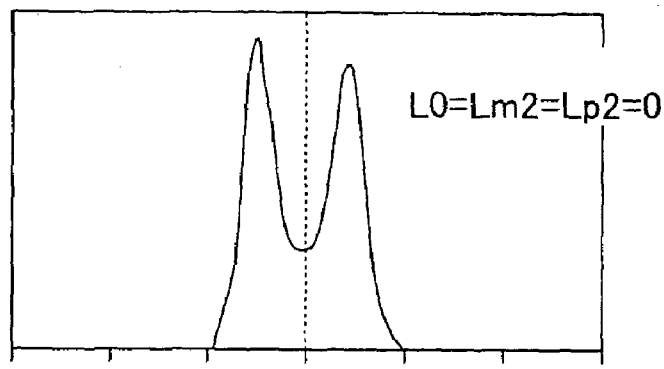
FIGS. 21A through 21D show still other four examples of illustrative settings of slice levels (relative to the distribution curve of the log likelihood ratios) that are used in the hard-decision section of the present invention, also showing how the slice levels "Lp" and "Lm" are calculated, depending on the number of times (i.e., 2, 5, 8, and 10 for FIGS. 21A, 21B, 21C and 21D respectively) to repeat the decoding process according to an iterative decoding method employed in the present invention.

When the number of repetitions of the decoding process is small (for example, two repetitions) as shown in FIG. 21A, there is an unignorable frequency distribution of the log likelihood ratios "$L(u^*)$" around the center value, zero, and therefore, the distribution curve of the log likelihood ratios "$L(u^*)$" is not regarded as separated away from the origin 0 (to the positive side nor to the negative side). In this case, the probability of the log likelihood ratio of taking place in the neighborhood of zero is relatively high, and there is a constraint of the maximum length of loss-correction in the ECC decoding. Therefore, the difference between the two slice levels ("Lp" minus "Lm") becomes small, and it becomes difficult to practically distinguish them from each other. Therefore, the slice levels "Lp" and "Lm" are set to zero. If this is the case, the flag bit "Fk" is set to "1" only when the log likelihood ratio "$L(u^*)$" is zero.

As the number of repetitions of the decoding process increases (as shown in FIGS. 21A through 21D), the distribution of the log likelihood ratios "$L(u^*)$" becomes separated to positive side and to negative side, and therefore, the probability of the log likelihood ratio "$L(u^*)$" to take place in the neighborhood of zero decreases, and, as a result, the difference ("Lp" minus "Lm") of the slice levels can be increased sequentially.

Figure 21B:
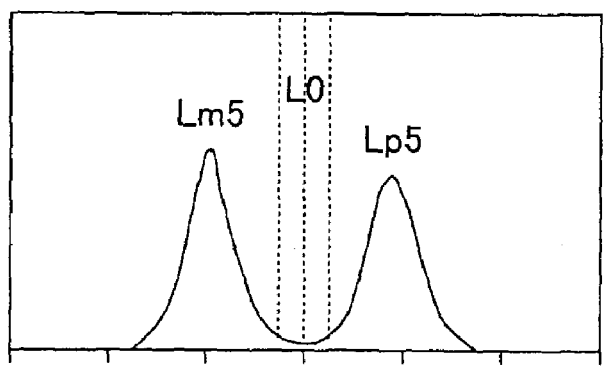
Figure 21C:
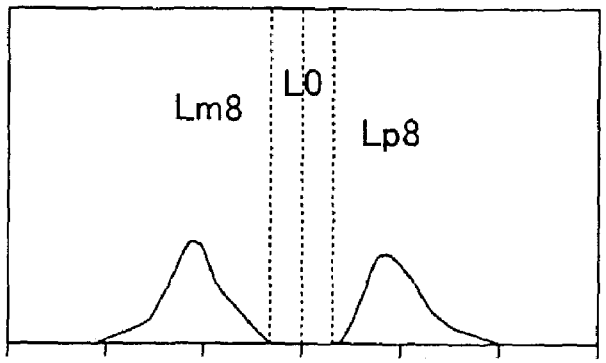
Figure 21D:
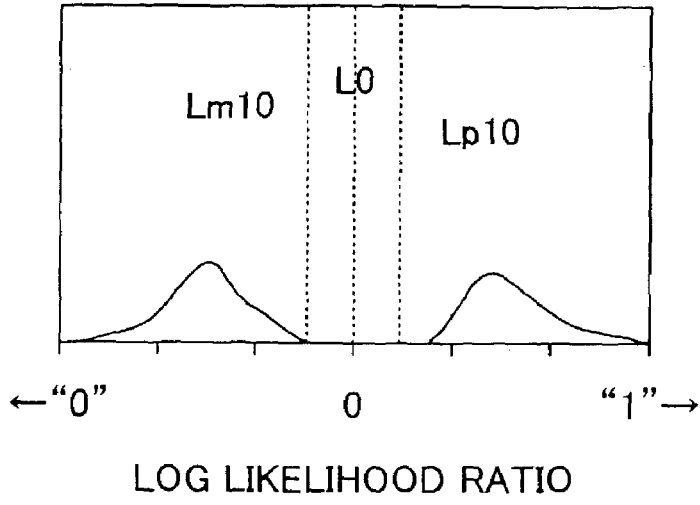

To be more precise, FIG. 21B shows slice levels "Lp5" and "Lm5" that are set when the number of repetitions of the decoding process is five. FIG. 21C shows slice levels "Lp8" and "Lm8" that are set when the number of repetitions of the decoding process is eight. FIG. 21D shows slice levels "Lp10" and "Lm10" that are set when the number of repetitions of the decoding process is ten. In this embodiment, the differences of respective slice levels satisfy the following relations:

$$(Lp5-Lm5)<(Lp8-Lm8)<(Lp10-Lm10)$$

As stated above, the settings of the slice levels used in the hard-decision section 477 (or 477a) of the iterative decoder 47 can be set and adjusted in response to a decoding condition (for example, the recording condition of data at the recording medium or the number of repetitions of the decoding process). Therefore, the slice levels used in the hard-decision processes can be adjusted to suitable values, which is especially advantageous when data from various types of recording media are decoded under various conditions of decoding. This makes it possible to provide a data readout device with improved data detection ability.

In each of the data readout devices illustrated in the above embodiments of the present invention, the MO 110 is used as a data recording medium for the data readout device and the reading system is implemented in the data readout device. Nonetheless, the present invention is also applicable to data readout devices that are of read-only types (i.e., having no writing or recording function). The present invention is also applicable to data readout devices that read data from other recording media (for example, magnetic disks, optical disks, magnetic tapes, etc).

In the above embodiments of the present invention, each of the second comparator 4772, the third comparator 4773 and the flag bit checker circuit 4774 of the hard-decision section 477 (shown in FIG. 10) and the first comparator 4775, the second comparator 4776 and the decoder/checker circuit 4777 of the hard-decision section 477a is regarded as helping to determine the reliability of each data bit. The ECC decoding circuit 50 is regarded as performing an error-correction decoding operation. Further, the controller 48 (shown in FIG. 6) is regarded as a range-setting measure that sets and adjusts a predetermined likelihood-data range that is used to detect hard-decisions that lack sufficient reliability.

In conclusion, according to the present invention, the likelihood data obtained by the iterative decoding processes can be decoded into more correct data with the help of the error correction. This is true even when it seems that there is not sufficient reliability in hard-decisions that are performed with respect to the likelihood data. Therefore, the number of repetitions of the decoding process can be reduced. Thus, the data transfer rate of transferring decoded data when reading out from the recording medium is kept from slowing down, i.e., improved to the utmost, concurrently with the advantageous effect that the data can be decoded with greater accuracy.

The present invention is not limited to the specifically disclosed embodiments, or variants, and variations and modifications may be made without departing from the scope of the present invention.

This application claims priority rights of and is based on Japanese patent application No. 2002-002264 filed on Jan. 9, 2002 in the Japanese Patent Office, the entire contents of which are hereby incorporated by reference.

What is claimed is:

1. A data readout device comprising:
   a likelihood data generating part generating a likelihood data in accordance with an iterative decoding method corresponding to a turbo-coding process, wherein the iterative decoding process is performed on a sampled value obtained by sampling a signal read out from a data recording medium at a predetermined sampling period;
   a hard-decision part performing a hard-decision on the likelihood data provided by said likelihood data generating part, and determining whether or not each data bit is one obtained from the likelihood data within a predetermined range in which the hard-decision is regarded as lacking sufficient reliability; and
   an error correcting decoder that performs an error correcting decoding operation using a predetermined rule and using a result of the determination made by said hard-decision part corresponding to said data bit so as to generate corrected decoded data,
   wherein said corrected decoded data provided by said error correcting decoder is then output from said data readout device without being provided to said likelihood data generating part, and
   further comprising a range-setting part that can set and adjust said predetermined range,
   wherein said range-setting part sets said predetermined range based on the number of repetitions of the decoding process in accordance with said iterative decoding method.

2. The data readout device as claimed in claim 1, wherein said reliability determination part outputs said result of reliability determination as flag data that is paired with said corresponding data bit.

3. The data readout device as claimed in claim 1, wherein said error correcting decoder handles said data bit as an erroneous data when said reliability determination part determines that said data bit is one obtained from said likelihood data within said predetermined range.

4. The data readout device as claimed in claim 3, wherein said error correcting decoder performs an ECC decoding operation, wherein said data bit determined as one obtained from said likelihood data within said predetermined range is handled as lost data to perform a process based on a loss correcting decoding method.

5. The data readout device as claimed in claim 1, wherein said reliability determination part employs two slice levels that define said predetermined range in order to determine whether each data bit is one obtained from said likelihood data falling within said predetermined range.

6. The data readout device as claimed in claim 5, wherein said likelihood data generated in accordance with said iterative decoding method is a value in a continuously expressed numerical range corresponding to probabilities from the maximum probability of said data bit being 1 through the maximum probability of said data bit being 0,
   wherein said two slice levels comprise a first slice level that is larger than the median of said numerical range and a second slice level that is smaller than the median of said numerical range;
   wherein the median of said numerical range is used as a slice level for making said hard-decision on said likelihood data.

7. The data readout device as claimed in claim 6, wherein said likelihood data generated in accordance with said iterative decoding method is a log likelihood ratio defined based on a ratio of the probability of said data bit being 1 and the probability of said data bit being 0.

8. The data readout device as claimed in claim 5, wherein said likelihood data generated in accordance with said iterative decoding method is a value in a continuously expressed numerical range corresponding to probabilities from the maximum probability of said data bit being 1 to the maximum probability of said data bit being 0,
   wherein said two slice levels comprise a first slice level that is larger than the median of said numerical range and a second slice level that is smaller than the median of said numerical range,
   wherein one hard-decision for deciding whether said data bit is 1 based on said first slice level and one hard-decision for deciding whether said data bit is 0 based on said second slice level are respectively performed,
   wherein said data bit as the hard-decision result corresponding to said likelihood data within said predetermined range defined by said first and second slice levels regarded as lacking sufficient reliability due to said hard-decision is set to a predetermined value of either 1 or 0.

9. The data readout device as claimed in claim 8, wherein said likelihood data generated in accordance with said iterative decoding method is a log likelihood ratio defined based on a ratio of the probability of said data bit being 1 and the probability of said data bit being 0.

10. The data readout device as claimed in claim 1, comprising a controller that can substantially disable the function of said range-setting part when the number of repetitions of the decoding process in accordance with said iterative decoding method does not exceed a predetermined number.

11. The data readout device comprising:
    a likelihood data generating part generating a likelihood data in accordance with an iterative decoding method corresponding to a turbo-coding process, wherein the iterative decoding process is performed on a sampled value obtained by sampling a signal read out from a data recording medium at a predetermined sampling period;

a hard-decision part performing a hard-decision on the likelihood data provided by said likelihood data generating part, and determining whether or not each data bit is one obtained from the likelihood data within a predetermined range in which the hard-decision is regarded as lacking sufficient reliability; and an error correcting decoder that performs an error correcting decoding operation using a predetermined rule and using a result of the determination made by said hard-decision part corresponding to said data bit so as to generate corrected decoded data, wherein said corrected decoded data provided by said error correcting decoder is then output from said data readout device without being provided to said likelihood data generating part, and further comprising a range-setting part that can set and adjust said predetermined range, wherein said two slice levels that define said predetermined range can be set and adjusted using said range-setting part, wherein said likelihood data generated in accordance with said iterative decoding method is a value in a continuously expressed numerical range corresponding to probabilities from the maximum probability of said data bit being 1 to the maximum probability of said data bit being 0, wherein said two slice levels comprise a first slice level that is larger than the median of said numerical range and a second slice level that is smaller than the median of said numerical range, and wherein said range-setting part sets said first and second slice levels to respective values based on the number of repetitions of the decoding process in accordance with said iterative decoding method.

12. The data readout device as claimed in claim 11, wherein said range-setting part sets said predetermined range by making reference to likelihood data that corresponds to a peak position in a likelihood data histogram generated on random data in accordance with said iterative decoding method.

13. The data readout device as claimed in claim 11, wherein said likelihood data generated in accordance with said iterative decoding method is a value in a continuously expressed numerical range corresponding to probabilities from the maximum probability of said data bit being 1 to the maximum probability of said data bit being 0, wherein said two slice levels comprise a first slice level that is larger than the median of said numerical range and a second slice level that is smaller than the median of said numerical range, wherein said range-setting part sets said first and second slice levels to respective numerical values that are respectively closer to the median than numerical values of likelihood data that correspond to peak positions in a likelihood data histogram generated on random data in accordance with said iterative decoding method.

14. The data readout device as claimed in claim 11, wherein said range-setting part sets said predetermined range by using the standard deviation of a likelihood data histogram generated on random data in accordance with said iterative decoding method.

15. The data readout device as claimed in claim 11, wherein said likelihood data generated in accordance with said iterative decoding method is a value in a continuously expressed numerical range corresponding to probabilities from the maximum probability of said data bit being 1 to the maximum probability of said data bit being 0, wherein said two slice levels comprise a first slice level that is larger than the median of said numerical range and a second slice level that is smaller than the median of said numerical range, wherein said range-setting part sets said first and second slice levels to respective numerical values that are respectively larger and smaller than the median by the standard deviation of a likelihood data histogram generated on random data in accordance with said iterative decoding method.

16. The data readout device as claimed in claim 11, wherein said range-setting part sets said predetermined range based on a range of likelihood data whose frequencies in a likelihood data histogram generated on random data in accordance with said iterative decoding method do not exceed a predetermined number.

17. The data readout device as claimed in claim 11, wherein said likelihood data generated in accordance with said iterative decoding method is a value in a continuously expressed numerical range corresponding to probabilities from the maximum probability of said data bit being 1 to the maximum probability of said data bit being 0, wherein said two slice levels comprise a first slice level that is larger than the median of said numerical range and a second slice level that is smaller than the median of said numerical range, wherein said range-setting part sets said first and second slice levels to respective values that make the limits of a range that includes the median of said numerical range, wherein said range that includes the median of said numerical range is a range of likelihood data whose frequencies in a likelihood data histogram generated on random data in accordance with said iterative decoding method do not exceed a predetermined number.

18. The data readout device as claimed in claim 11, comprising a controller that can substantially disable the function of said range-setting part when the number of repetitions of the decoding process in accordance with said iterative decoding method does not exceed a predetermined number.

* * * * *